United States Patent
Nagaya et al.

(10) Patent No.: US 7,352,113 B2
(45) Date of Patent: Apr. 1, 2008

(54) PIEZOELECTRIC ACTUATOR

(75) Inventors: Toshiatsu Nagaya, Kuwana (JP);
Tatsuhiko Nonoyama, Chiryu (JP);
Masaya Nakamura, Nagoya (JP);
Yasuyoshi Saito, Toyota (JP); Hisaaki Takao, Seto (JP); Takahiko Homma, Nagoya (JP); Kazumasa Takatori, Nagoya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/717,798

(22) Filed: Mar. 13, 2007

(65) Prior Publication Data
US 2007/0159028 A1    Jul. 12, 2007

Related U.S. Application Data

(63) Continuation of application No. PCT/JP05/17230, filed on Sep. 13, 2005.

(30) Foreign Application Priority Data

Sep. 13, 2004  (JP)  ............. 2004-266111
Aug. 5, 2005   (JP)  ............. 2005-228397

(51) Int. Cl.
  *H01L 41/08*   (2006.01)
(52) U.S. Cl. ............... 310/358; 310/328; 310/340
(58) Field of Classification Search ........ 310/357–359; 252/62.9
See application file for complete search history.

(56) References Cited

U.S. PATENT DOCUMENTS 6,884,364 B2   4/2005   Sato et al.

2004/0127344 A1   7/2004   Sato et al.

FOREIGN PATENT DOCUMENTS

| EP | 1 283 553 A2 | 2/2003 |
| JP | 11-180766 A | 7/1999 |
| JP | 2003-046154 A | 2/2003 |
| JP | 2003-128460 A | 5/2003 |
| JP | 2004-115293 A | 4/2004 |

*Primary Examiner*—Mark Budd
(74) *Attorney, Agent, or Firm*—Harness, Dickey & Pierce, PLC

(57) ABSTRACT

The piezoelectric actuator includes a piezoelectric element (2) including a sheet of piezoelectric ceramic and electrodes formed at least part of the surface of the sheet of piezoelectric ceramic, and a holding member (4) holding the piezoelectric element (2);
  The piezoelectric at least one of the requirements (a) to (e) described below;
  (a) The bulk density shall be equal to or smaller than 5 g/cm$^3$, and the Young's modulus $Y_{11}^E$ calculated according to a resonance-antiresonance method shall be equal to or larger than 90 GPa;
  (b) The coefficient of thermal conductivity shall be equal to or larger than 2 $Wm^{-1}K^{-1}$;
  (c) The coefficient of thermal expansion shall be equal to or larger than 3.0 ppm/° C. over a temperature range from −30° C. to 160° C.;
  (d) The pyroelectric coefficient shall be equal to or smaller than 400 $\mu Cm^{-2}K^{-1}$ over the temperature range from −30° C. to 160° C.;
  (e) The mechanical quality factor Qm calculated according to the resonance-antiresonance method shall be equal to or smaller than 50 over a temperature range from −30° C. to 80° C.

12 Claims, 10 Drawing Sheets

PIEZOELECTRIC ACTUATOR

CROSS-REFERENCE TO RELATED APPLICATIONS

This application is based and claims priority of Japanese Patent Applications Nos. 2004-266111, filed Sep. 13, 2004 and 2005-228397, filed Aug. 5, 2005, each of which are hereby incorporated by reference, and is a Continuation of PCT/JP2005/017230, filed Sep. 13, 2005 the contents being incorporated herein.

BACKGROUND OF THE INVENTION

1. Field of the Invention

The present invention relates to a piezoelectric actuator, that utilizes a reverse piezoelectric effect and an electrostrictive effect under the influence of a large electric field, such as a laminated actuator, a piezoelectric transformer, an ultrasonic motor, a bimorph cell, a sonar, a piezoelectric ultrasonic transducer, a piezoelectric buzzer, or a piezoelectric loudspeaker.

2. Description of the Related Art

Piezoelectric actuators utilizing piezoelectric ceramic materials are industrial products that convert electric energy into mechanical energy by making the most of a displacement attributable to a reverse piezoelectric effect, and are widely applied to the fields of electronics and mechatronics.

The piezoelectric actuator includes: a piezoelectric element that has at least has one pair of electrodes formed on a sheet of piezoelectric ceramic; a holding part that holds the piezoelectric element; an adhesive member or a constraining member such as a spring that constrains the piezoelectric element to stay in the holding part; a lead via which a voltage is applied to the piezoelectric element and an electrical insulation member such as a resin or silicone oil that is coated over the pair of electrodes. In the piezoelectric actuator, the piezoelectric element including the sheet of piezoelectric ceramic is constrained by means of adhesion, molding, or a spring. Although no voltage is applied, a mechanical force of constraint (presetting load) is applied. Moreover, in the piezoelectric actuator, when a voltage is applied to the piezoelectric actuator, the piezoelectric element is displaced along with a rise in the voltage. This increases the mechanical force of constraint (increases the load).

Consequently, the displacement of the piezoelectric actuator, unlike the displacement performance of the piezoelectric element itself, is smaller due to a presetting load and an increase in the load.

The working conditions and driving conditions for the piezoelectric actuator include such parameters as the temperature, driving electric field strength, driving waveform, driving frequency, and whether a driving mode is continuous driving or intermittent driving. A temperature range varies greatly depending on the ambient temperature for use of products. The lower limit of the temperature range is equal to or higher than −40° C. and the upper limit thereof is equal to or lower than about 160° C. For a piezoelectric buzzer, a sonar, a piezoelectric loudspeaker, or the like, the amplitude in driving electric field strength is equal to or smaller than 500 V/mm. For an ultrasonic motor, a piezoelectric transformer, or the like, the amplitude is equal to or smaller than 1000 V/mm. For a laminated actuator, the amplitude is equal to or smaller than 3000 V/mm. Moreover, when resonant driving is adopted as a driving form, the driving waveform is a sine wave. For the other driving forms, the driving waveform may be any of various waves, that is, the sine wave, a trapezoidal wave, a triangular wave, a rectangular wave, and a pulsating wave. Moreover, the driving frequency employed for the ultrasonic motor, sonar, piezoelectric ultrasonic transducer, or the like is equal to or higher than 20 kHz, while the driving frequency employed for the other products falls below 20 kHz.

As the piezoelectric ceramic employed in the piezoelectric actuator, for example, a lead zirconium titanate (Pb(Zr, Ti)O$_3$) system (hereinafter a PZT system) or the like has been adopted. The PZT-system piezoelectric ceramic exhibits high piezoelectric properties, and is used for a majority of piezoelectric ceramics that are currently used in practice. However, as the PZT-system piezoelectric ceramic contains lead oxide (PbO) exhibiting a high vapor pressure, the load it imposes on an environment is large.

Various piezoelectric ceramics of a barium titanate (BaTiO$_3$) system containing no lead have been developed.

Specifically, for example, Japanese Unexamined Patent Publication No. 11-180766 has disclosed a composition whose piezoelectric strain constant d$_{33}$ measured according to a resonance method is equal to or larger than 300 pC/N. The rate of temperature-dependent change in the piezoelectric strain constant d$_{33}$ is small at the temperatures ranging from −30° C. to 85° C.

Japanese Unexamined Patent Publication No. 2003-128460 has disclosed a piezoelectric element that includes a sheet of a barium titanate system piezoelectric ceramic and an electrode. Herein, the rate of temperature-dependent change in a piezoelectric strain constant d$_{31}$ calculated from a distortion factor exhibited by the element with a signal having an amplitude in electric field strength of 1 kV/mm applied thereto is small.

However, the piezoelectric actuator including the conventional piezoelectric element is not strong enough to withstand practical use.

The piezoelectric actuator is requested to exhibit various characteristics according to the usages of diverse industrial products, such as, a laminated actuator, a piezoelectric transformer, an ultrasonic motor, a bimorph cell, a sonar, a piezoelectric ultrasonic transducer, a piezoelectric buzzer, and a piezoelectric loudspeaker. However, in reality, no piezoelectric actuator fully satisfies the characteristics requested by the diverse industrial products such as the laminated actuator, piezoelectric transformer, ultrasonic motor, bimorph cell, sonar, piezoelectric buzzer, and piezoelectric loudspeaker. Further improvements have been demanded.

SUMMARY OF THE INVENTION

The present invention addresses the foregoing problems underlying the related arts, and attempts to provide a piezoelectric actuator that enjoys excellent practicality.

The present invention provides a piezoelectric actuator including a piezoelectric element that has a pair of electrodes formed on the surface of a sheet of piezoelectric ceramic, and a holding member that holds the piezoelectric element.

The piezoelectric ceramic employed in the piezoelectric actuator satisfies at least one of the requirements (a) to (e) described below.

(a) The bulk density shall be equal to or smaller than 5 g/cm$^3$, and the Young's modulus $Y_{11}^E$ calculated according to a resonance-antiresonance method shall be equal to or larger than 90 GPa.

(b) The coefficient of thermal conductivity shall be equal to or larger than 2 $Wm^{-1}K^{-1}$.

(c) The coefficient of thermal expansion shall be equal to or larger than 3.0 ppm/° C. over a temperature range from −30° C. to 160° C.

(d) The pyroelectric coefficient shall be equal to or smaller than 400 $\mu Cm^{-2}K^{-1}$ over the temperature range from −30° C. to 160° C.

(e) The mechanical quality factor Qm calculated according to the resonance-antiresonance method shall be equal to or smaller than 50 over a temperature range from −30° C. to 80° C.

In the piezoelectric actuator according to the present invention, the piezoelectric ceramic satisfies at least one of the requirements (a) to (e). The piezoelectric actuator therefore enjoys excellent practicality.

The advantages of the piezoelectric actuator in accordance with the present invention will be described below in relation to each of the requirements.

When the piezoelectric ceramic satisfies at least the requirement (a), the weight of the piezoelectric actuator can be decreased, and noise generated when the piezoelectric actuator is driven can be reduced. Moreover, as the resonant frequency of the piezoelectric ceramic gets higher, the piezoelectric actuator can make a quick response or displacement despite a high driving frequency. This permits the piezoelectric actuator to be operated quickly.

Generally, the piezoelectric actuator may generate noise when being driven. The noise is attributable to the fact that when the piezoelectric element stretches or contracts and the holding member such as a casing included in the piezoelectric actuator or any member to which the piezoelectric actuator is attached resonates together with the piezoelectric actuator. Therefore, when the piezoelectric actuator itself is designed or an industrial product employing the piezoelectric actuator is designed, the structure thereof should be designed to prevent resonance. For example, when the piezoelectric actuator is adapted to a fuel injection valve to be driven with a trapezoidal wave, as the driving frequency is high or the voltage raising rate is high and the structure is complex, it is hard to prevent resonance by the design of the structure.

When a piezoelectric ceramic satisfies the requirement (a) according to the present invention, since the weight of the piezoelectric ceramic decreases, kinetic energy exerted in driving the actuator gets smaller. Consequently, generation of noise can be minimized. Furthermore, since the piezoelectric actuator makes a quick response or displacement despite a high driving frequency, the piezoelectric actuator can be operated fast. The piezoelectric actuator enjoys excellent practicality when adapted to, for example, a fuel injection valve or the like.

Generally, when a piezoelectric actuator is driven, the temperature of the piezoelectric actuator may rise. A displacement made by the piezoelectric actuator or any other characteristic may change along with the rise in temperature.

When a piezoelectric ceramic satisfies the requirement (b) according to the present invention, the heat radiation performance of the piezoelectric ceramic improves. A rise in the temperature of a piezoelectric actuator can therefore be suppressed. Consequently, a change in a displacement or any other characteristic derived from the rise in the temperature of the piezoelectric ceramic can be suppressed. Therefore, the piezoelectric actuator enjoys excellent practicality.

Generally, when a piezoelectric actuator is used at the ambient temperature of, for example, 120° C. or more, if a rise in the temperature of the piezoelectric actuator is large, the piezoelectric actuator is likely to have high temperature. Consequently, there is a fear that the piezoelectric actuator itself or a holding member or the like made of, for example, a resin and included in the piezoelectric actuator may be thermally aged.

When a piezoelectric ceramic satisfies the requirement (b), since a rise in temperature can be suppressed, the thermal aging of a holding member can be prevented. Consequently, if a piezoelectric actuator is adapted to, for example, an ultrasonic motor, a sonar, or an ultrasonic transducer whose holding member is relatively readily thermally aged, the piezoelectric actuator would prove practical. Moreover, in the case of the ultrasonic motor, sonar, or ultrasonic transducer, not only the holding member but also an adhesive member is made of, for example, a resin. The adhesive member may be used to attach the piezoelectric element to a support or any other member made of a metal. Even in this case, as long as the piezoelectric ceramic satisfies the requirement (b), as a rise in temperature can be suppressed, the thermal aging of the adhesive member can be prevented.

When a piezoelectric ceramic satisfies the requirement (c), a difference in thermal expansion between the piezoelectric ceramic and an electrode, a holding member, or any other member coming into contact with the piezoelectric ceramic can be decreased.

Generally, the temperature of a piezoelectric actuator changes along with a change in the ambient temperature for use or due to a rise in the temperature occurring when the piezoelectric actuator is driven. Moreover, even during manufacturing of the piezoelectric actuator, for example, when a piezoelectric element is heated and attached to something, the temperature of the piezoelectric actuator changes. When the change in temperature occurs, a difference in thermal expansion may occur between the piezoelectric ceramic and an electrode, a holding member, or any other member coming into contact with the piezoelectric ceramic. As a result, a thermal stress may be generated in the piezoelectric actuator. Eventually, the piezoelectric actuator may be broken.

When a piezoelectric ceramic satisfies the requirement (c) according to the present invention, as a difference in thermal expansion can be decreased, a piezoelectric actuator can be protected from being broken due to the thermal stress.

Moreover, when a piezoelectric actuator is adapted to an ultrasonic motor, a sonar, a piezoelectric ultrasonic transducer, a piezoelectric buzzer, or a piezoelectric loudspeaker, a piezoelectric element employing a piezoelectric ceramic and any other member may be heated and attached to each other using, for example, a thermosetting resin. Even in this case, as long as the piezoelectric ceramic satisfies the requirement (c), as the difference in thermal expansion can be decreased, the piezoelectric actuator can be prevented from being broken due to a thermal stress and a residual thermal stress generated in heating and attaching. Consequently, the piezoelectric actuator employing the piezoelectric ceramic that satisfies the requirement (c) would prove highly practical when adapted to the ultrasonic motor, sonar, piezoelectric ultrasonic transducer, piezoelectric buzzer, or piezoelectric loudspeaker.

When a piezoelectric ceramic satisfies the requirement (d), occurrence of a pyroelectric effect in a piezoelectric actuator can be restricted.

Generally, when a piezoelectric actuator or an industrial product having the piezoelectric actuator incorporated therein is being manufactured, or being transported or stored after it is finished, if the temperature thereof is changed, there is a fear that a voltage may be developed in the piezoelectric actuator due to the pyroelectric effect. In efforts to avoid the development of a voltage, a metallic clip jig or the like is used to short-circuit the connection between electrode terminals included in the piezoelectric actuator, or the configuration of a product is modified in order to connect a resistor between the electrode terminals. As a result, a process, the metallic clip jig, or a part such as the resistor that is originally unnecessary to fabricate the piezoelectric actuator becomes necessary. This may lead to an increase in the cost of manufacture.

When a piezoelectric ceramic satisfies the requirement (d) according to the present invention, occurrence of the pyroelectric effect in a piezoelectric actuator can be restricted. Therefore, a manufacturing process or a part needed to prevent the pyroelectric effect in related arts need not be included any longer, and the cost of manufacture can be reduced. Therefore, the piezoelectric actuator would prove highly practical when adopted as an actuator that includes, for example, a laminated or a thick piezoelectric element which generates a large amount of charge due to the pyroelectric effect, that is, when adapted to, for example, a fuel injection valve, a laminated piezoelectric transformer, a laminated ultrasonic motor, or a laminated piezoelectric loudspeaker.

When a piezoelectric ceramic satisfies the requirement (e), a sound pressure generated at any point other than a resonating point is increased. Therefore, a difference in the sound pressure between the resonating point and any other point in a piezoelectric actuator is decreased. The piezoelectric actuator would prove highly practical when adapted to, for example, a piezoelectric buzzer, a piezoelectric loudspeaker, or a piezoelectric sounding part such as a transceiver.

As described so far, according to the present invention, there is provided a piezoelectric actuator that enjoys excellent practicality.

DESCRIPTION OF THE PREFERRED EMBODIMENTS

Figure 1:
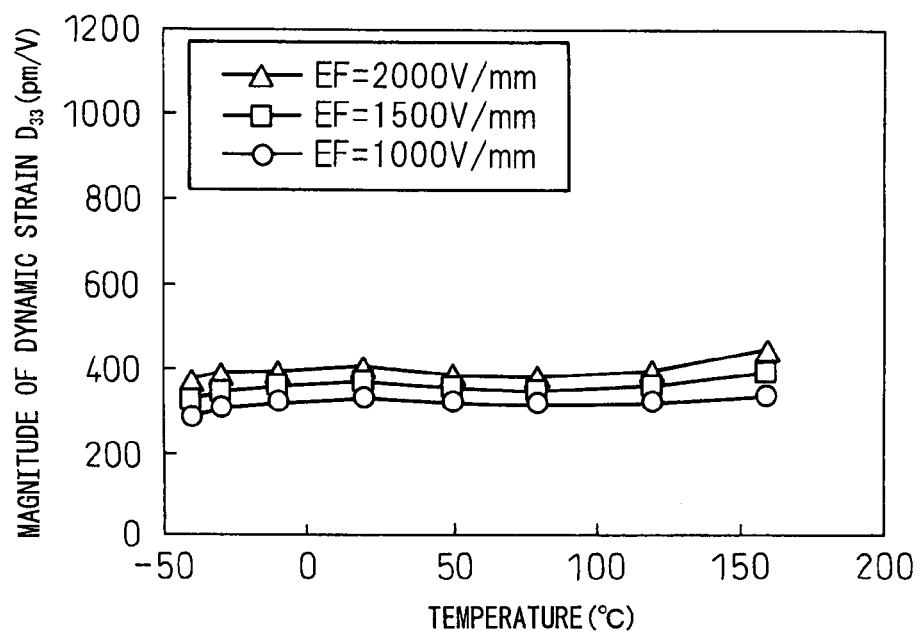
FIG. 1 is a graph showing the temperature dependency of a magnitude of dynamic strain D33 exhibited by a piezoelectric actuator in accordance with an example 1.

A piezoelectric actuator in accordance with the present invention includes a piezoelectric element and a holding member. The piezoelectric element includes a sheet of piezoelectric ceramic and electrodes formed on at least part of the surface of the sheet of piezoelectric ceramic.

Specifically, the piezoelectric element is composed of, for example, a sheet of piezoelectric ceramic and a pair of electrodes sandwiching the sheet of piezoelectric ceramic.

Moreover, as the piezoelectric element, a laminated piezoelectric element having multiple sheets of piezoelectric ceramic and multiple electrodes alternately stacked may be adopted. When the laminated piezoelectric element is adopted as the piezoelectric element, a magnitude of displacement made by the piezoelectric actuator is increased.

The holding member holds the piezoelectric element and is realized as, for example, a contractile tube made of a resin.

A piezoelectric ceramic employed in the piezoelectric actuator in accordance with the present invention satisfies at least one of the requirements (a) to (e).

The requirement (a) stipulates that the bulk density shall be equal to or smaller than 5 g/cm$^3$ and the Young's modulus $Y_{11}^E$ calculated according to a resonance-antiresonance method shall be equal to or larger than 90 GPa. When the bulk density of a piezoelectric ceramic exceeds 5 g/cm$^3$, noise occurring during driving of a piezoelectric actuator may be intensified. The lower limit of the bulk density should be equal to or larger than 4.4 g/cm$^3$ for fear the strength and displacement of the piezoelectric actuator may be decreased.

The bulk density of a piezoelectric ceramic can be measured according to, for example, a method described below.

The dry weight W1 [g] of a ceramic, the underwater weight W2 [g] thereof, and the wet weight W3 [g] thereof are measured, and the bulk density of the ceramic is then calculated according to the following equation (Archimedes' method):

Bulk density=$(W1 \times \rho w)/(W3-W2)$ where $\rho w$ denotes the density [g/cm$^3$] of water observed when the underwater weight is measured.

When a Young's modulus $Y_{11}^E$ measured according to the resonance-antiresonance method falls below 90 GPa, the driving frequency for a piezoelectric actuator may decrease. Preferably, the Young's modulus $Y_{11}^E$ should be equal to or larger than 95 GPa. More preferably, the Young's modulus $Y_{11}^E$ should be equal to or larger than 100 GPa. Assuming that a piezoelectrically active part that makes a displacement when driven and a piezoelectrically inactive part that hardly makes a displacement even when driven coexist in the piezoelectric actuator in the same manner as they do in a laminated actuator or a piezoelectric transformer, an internal stress is generated during driving. In efforts to decrease the internal stress, the upper limit of the Young's modulus $Y_{11}^E$ should be equal to or smaller than 120 GPa.

The Young's modulus $Y_{11}^E$ can be measured according to the resonance-antiresonance method. According to the resonance-antiresonance method, the Young's modulus $Y_{11}^E$ may be measured as described in "Standard EMAS-6001 by Electronic Materials Manufacturers Association of Japan on Piezoelectric Ceramic Transducer Testing Method—vibrations in radial direction of disk transducer" (edited by Committee of Piezoelectric Ceramic Technology at Electronic Materials Manufacturers Association of Japan, Jul. 20, 1977), "Standard EMAS-6007 by Electronic Materials Manufacturers Association of Japan on Piezoelectric Ceramic Transducer Testing Method—measurement and calculation of material constant" (edited by Committee of Piezoelectric Ceramic Technology at Electronic Materials Manufacturers Association of Japan, March, 1986), or "Standard EMAS-6100 by Electronic Materials Manufacturers Association of Japan on Electrical Testing Method for Piezoelectric Ceramic Transducer" (edited by Committee of Piezoelectric Ceramic Technology at Electronic Materials Manufacturers Association of Japan, March, 1993).

The requirement (b) stipulates that the coefficient of thermal conductivity shall be equal to or larger than 2 Wm$^{-1}$K$^{-1}$.

When the coefficient of thermal conductivity falls below 2 Wm$^{-1}$K$^{-1}$, the heat radiation performance may be degraded. As a result, the temperature of a piezoelectric actuator is likely to rise during driving thereof, and a displacement or any other characteristic is likely to fluctuate. Preferably, the coefficient of thermal conductivity should be equal to or larger than 2.2 Wm$^{-1}$K$^{-1}$.

The coefficient of thermal conductivity of a piezoelectric ceramic can be measured according to, for example, a method described below.

Specifically, a coefficient of thermal diffusivity is measured according to a laser pulse heating method. A specific heat is measured according to differential scanning calorimetry (DSC). The coefficient of thermal conductivity is then calculated according to the following equation:

$\lambda = \alpha \rho Cp$ where $\lambda$ denotes a coefficient of thermal conductivity [Wm$^{-1}$K$^{-1}$], $\alpha$ denotes a coefficient of thermal diffusivity [10$^{-7}$ m$^2$s$^{-1}$], $\rho$ denotes the bulk density [kg/m$^3$] of a piezoelectric ceramic, and Cp denotes a specific heat [Jkg$^{-3}$K$^{-1}$].

The requirement (c) stipulates that the coefficient of thermal expansion shall be equal to or larger than 3.0 ppm/° C. over a temperature range from −30° C. to 160° C.

Over the specific temperature range, if the coefficient of thermal expansion of a piezoelectric ceramic falls below 3.0 ppm/° C., there is a fear that a thermal stress may be readily generated in a piezoelectric actuator. As a result, the piezoelectric actuator may be readily broken.

Preferably, the coefficient of thermal expansion should be equal to or larger than 3.5 ppm/° C. More preferably, the coefficient of thermal expansion should be equal to or larger than 4.0 ppm/° C. If the coefficient of thermal expansion of a piezoelectric ceramic is larger than that of a metallic member that is made of iron (Fe) or the like and included in a piezoelectric actuator, the thermal stress is readily generated. From this viewpoint, the upper limit of the coefficient of thermal expansion should be equal to or larger than 11 ppm/° C.

The coefficient of thermal expansion of a piezoelectric ceramic can be measured according to, for example, a method described below.

Specifically, a coefficient of linear thermal expansion is measured according to a thermo-mechanical analysis (TMA) method, and the coefficient of thermal expansion is calculated according to the following equation:

$\beta = (1/L_0) \times (dL/dT)$ where $\beta$ denotes a coefficient of linear thermal expansion [10$^{-6}$/° C.], $L_0$ denotes the length of a specimen [m] at the reference temperature (25° C.), and dT denotes a difference in temperature [° C.], and dL denotes a length of expansion [m] associated with the temperature difference dT.

The requirement (d) stipulates that the pyroelectric coefficient shall be equal to or smaller than 400 μCm$^{-2}$K$^{-1}$ over a temperature range from −30° C. from 160° C.

When the pyroelectric coefficient of a piezoelectric ceramic exceeds 400 μCm$^{-2}$K$^{-1}$ over the specific temperature range, a pyroelectric effect is liable to occur. There is a fear that a voltage may be developed in a piezoelectric actuator due to a change in temperature.

Preferably, the pyroelectric coefficient of a piezoelectric ceramic should be equal to or smaller than 350 μCm$^{-1}$K$^{-1}$ over the temperature range from −30° C. from 160° C. More preferably, the pyroelectric coefficient of a piezoelectric ceramic should be equal to or smaller than 300 μCm$^{-2}$K$^{-1}$.

What is referred to as the pyroelectric coefficient is a mean temperature coefficient of a magnitude of polarization occurring in a piezoelectric ceramic. The pyroelectric coefficient can be measured according to, for example, a method described below.

The pyroelectric coefficient $\gamma$ is expressed by a defining equation $\gamma=dP/dT$ $[Cm^{-2}K^{-1}]$ (where P denotes a magnitude of polarization and T denotes a temperature). Normally, measurable parameters such as a current I, an area S of a specimen electrode, a change in temperature dT, and an interval dt between measurements are used to calculate the pyroelectric coefficient according to the equation below.

$$\gamma=(I/S)\times(dt/dT)[Cm^{-2}K^{-1}]$$

Specifically, a piezoelectric element is put in a thermostat or an electric oven in order to raise or lower the temperature of the piezoelectric element at a constant rate. At this time, a current I [A] flowing from each of the electrodes on the upper and lower sides of the piezoelectric element is measured using a microammeter. Current values measured during a measurement time t [s] are integrated in order to work out an amount of generated charge [C]. The amount of generated charge is then divided by the area of each electrode included in the piezoelectric element, whereby the temperature characteristic of the magnitude of polarization P $(C/cm^2)$ at each temperature is calculated. Thus, the temperature coefficient thereof is calculated (pyroelectric current method).

The requirement (e) stipulates that the mechanical quality factor Qm measured according to the resonance-antiresonance method shall be equal to or smaller than 50 over a temperature range from –30° C. to 80° C.

Over the foregoing specific temperature range, when the mechanical quality factor Qm of a piezoelectric ceramic exceeds 50, a sound pressure at any point other than a resonating point may decrease.

Preferably, the mechanical quality factor Qm of a piezoelectric ceramic should be equal to or smaller than 40 over a temperature range from –30° C. to 80° C. More preferably, the mechanical quality factor Qm should be equal to or smaller than 35. Incidentally, when the mechanical quality factor Qm is too small, an amplitude at a resonant frequency is small. This causes a sound pressure to decrease. The lower limit of the mechanical quality factor Qm should therefore be equal to or larger than 5.

The mechanical quality factor Qm can be measured according to, for example, a method described below.

According to the resonance-antiresonance method, the mechanical quality factor Qm is measured as described in "Standard EMAS-6001 by Electronic Materials Manufacturers Association of Japan on Piezoelectric Ceramic Transducer Testing Method—vibrations in radial direction of disk transducer" (emitted by Committee of Piezoelectric Ceramic Technology at Electronic Materials Manufacturers Association of Japan, Jul. 20, 1977), "Standard EMAS-6007 by Electronic Materials Manufacturers Association of Japan on Piezoelectric Ceramic Transducer Testing Method—measurement and calculation of material constant" (edited by Committee of Piezoelectric Ceramic Technology at Electronic Materials Manufacturers Association of Japan, March, 1986), or "Standard EMAS-6100 by Electronic Materials Manufacturers Association of Japan on Electrical Testing Method for Piezoelectric Ceramic Transducer" (edited by Committee of Piezoelectric Ceramic Technology at Electronic Materials Manufacturers Association of Japan, March, 1993).

Preferably, a piezoelectric ceramic employed in a piezoelectric actuator in accordance with the present invention should satisfy all of the requirements (a) to (e).

In this case, the practicality of a piezoelectric actuator is improved to the greatest extent.

Moreover, preferably, when a piezoelectric actuator is driven under such a driving condition that a driving voltage shall have a constant amplitude in electric field strength of 1000 V/mm or more, the piezoelectric actuator should satisfy the requirements (f) and (g) described below.

(f) A magnitude of dynamic strain D33 calculated by dividing a strain, which occurs in an electric field-applied direction in a piezoelectric actuator, by the electric field strength shall be equal to or larger than 250 pm/V over a temperature range from –30° C. to 80° C.

(g) The width of variation $W_{D33}$ in the magnitude of dynamic strain D33 derived from a change in temperature, which is expressed by the following equation (1), shall fall within ±14% over the specific temperature range from –30° C. to 80° C.:

$$W_{D33}(\%)=[\{2\times D33_{max}/(D33_{max}+D33_{min})\}-1]\times 100 \quad (1)$$

where $D33_{max}$ denotes the maximum value of the magnitude of dynamic strain observed over the temperature range from –30° C. to 80° C., and $D33_{min}$ denotes the minimum value of the magnitude of dynamic strain observed over the temperature range from –30° C. to 80° C.

When the requirements (f) and (g) are satisfied, the variance of a displacement made by a piezoelectric actuator derived from a change in temperature is reduced. In other words, even when the piezoelectric actuator is used under an environment in which temperatures change drastically, it will make a substantially constant displacement. Therefore, the piezoelectric actuator can be adapted to industrial products that are used under the environment in which temperatures change drastically, for example, can be adapted to automotive parts.

The temperature dependency of a displacement made by a piezoelectric actuator will be described below.

A displacement made by a piezoelectric actuator driven according to a constant voltage driving method is expressed by the following equation A1:

$$\Delta L1=D33\times EF\times L_0 \quad (A1)$$

where D33 denotes a magnitude of dynamic strain [m/V], EF denotes a maximum electric field strength [V/m], and $L_0$ denotes the length [m] of a sheet of piezoelectric ceramic observed before application of a voltage. What is referred to as the magnitude of dynamic strain is a magnitude of displacement made in a direction parallel to a voltage-applied direction by the sheet of piezoelectric ceramic when a high voltage that alternates from zero to 3000 V/mm in electric field strength and causes no dielectric breakdown is applied with the amplitude thereof held constant in order to drive the piezoelectric actuator. The magnitude of dynamic strain is expressed by the following equation A2:

$$D33=S/EF=(\Delta L1/L_0)/(V/L_0) \quad (A2)$$

where S denotes a maximum strain. The magnitude of dynamic strain D33 is not only temperature-dependent but also electric field strength-dependent.

As apparent from the equations (A1) and (A2), a displacement ($\Delta L1$) made by a piezoelectric actuator is proportional to the product of a magnitude of dynamic strain D33 dependent on applied electric field strength by the applied electric field strength.

In order to decrease the width of variation in a displacement made by an actuator over a temperature range for use, the temperature dependency of a magnitude of dynamic strain D33 dependent on driving electric field strength should be minimized.

Needless to say, a magnitude of dynamic strain D33 representing displacement performance should preferably be large.

If a piezoelectric actuator does not satisfy the requirement (f), that is, if a magnitude of dynamic strain D33 falls below 250 pm/V over a specific temperature range from −30° C. to 80° C., or if the piezoelectric actuator does not satisfy the requirement (g), that is, if the width of variation $W_{D33}$ in a magnitude of dynamic strain D33 derived from a change in temperature falls outside the range of ±14% over the specific temperature range from −30° C. to 80° C., a displacement made by the piezoelectric actuator may get smaller and the temperature dependency of the displacement may get larger.

When a piezoelectric actuator is driven under such a driving condition that a driving voltage shall have a constant amplitude in electric field strength of 100 V/mm or more, the piezoelectric actuator should preferably satisfy the requirements (h) and (i) described below.

(h) The magnitude of dynamic strain D33 calculated by dividing a strain, which occurs in an electric field-applied direction in the piezoelectric actuator, by the electric field strength shall be equal to or larger than 250 pm/V over a temperature range from −30° C. to 160° C.

(i) The width of variation $W_{D33}$ in the magnitude of dynamic strain D33 derived from a change in temperature, which is expressed by the following general equation (2), shall fall within ±14%:

$$W_{D33}(\%)=[\{2\times D33_{max}/D33_{max}+D33_{min})\}-1]\times 100 \quad (2)$$

where $D33_{max}$ denotes the maximum value of the magnitude of dynamic strain observed at the temperatures ranging from −30° C. to 160° C., and $D33_{min}$ denotes the minimum value of the magnitude of dynamic strain observed at the temperatures ranging from −30° C. to 160° C.

When a piezoelectric actuator satisfies the requirements (h) and (i), the temperature dependency of the piezoelectric actuator can be further improved. Namely, in this case, the temperature dependency of a displacement made by the piezoelectric actuator can be decreased over a wider temperature range from −30° C. to 160° C.

Preferably, a piezoelectric actuator in accordance with the present invention should be adapted to a fuel injection valve. In this case, the piezoelectric actuator in accordance with the present invention would exhibit the excellent characteristics thereof to the greatest extent.

Moreover, a piezoelectric actuator in accordance with the present invention may be adapted to a sonar, an ultrasonic motor, or a piezoelectric ultrasonic transducer.

Moreover, a piezoelectric actuator in accordance with the present invention may be adapted to a piezoelectric sounding part. The piezoelectric sounding part encompasses, for example, a piezoelectric buzzer and a piezoelectric loudspeaker.

Moreover, a piezoelectric element to be employed in a piezoelectric actuator in accordance with the present invention should preferably, be a laminated piezoelectric element having sheets of piezoelectric ceramic and electrodes stacked alternately.

In this case, the aforesaid advantage of restricting occurrence of the pyroelectric effect which is provided by the requirement (d) is markedly demonstrated. In general, when a laminated piezoelectric element is employed, an amount of charge attributable to the pyroelectric effect increases. Consequently, polarization occurring in the piezoelectric element is liable to deteriorate. Moreover, a worker who handles the piezoelectric element may be electrically shocked. However, according to the present invention, as long as the requirement (d) is satisfied, even when the laminated piezoelectric element is employed, occurrence of the pyroelectric effect can be suppressed.

The laminated piezoelectric element has a structure in which sheets of piezoelectric ceramic and electrodes are stacked alternately. Specifically, for example, the structure may be an electrode-united and fired structure realized by alternately stacking multiple sheets of piezoelectric ceramic, which are not fired, and multiple electrodes and then firing the laminated body, or a structure realized by bonding multiple piezoelectric elements each of which has electrodes formed on a fired sheet of piezoelectric ceramic.

Moreover, a piezoelectric ceramic employed in a piezoelectric actuator in accordance with the present invention should preferably be a piezoelectric ceramic that does not contain lead.

In this case, the harmlessness of the piezoelectric actuator to an environment can be improved.

Preferably, a piezoelectric ceramic to be employed in a piezoelectric actuator in accordance with the present invention should be a grain-oriented piezoelectric ceramic that is made from a polycrystalline substance whose main phase exists as an isotropic perovskite compound expressed by a general formula $\{Li_x(K_{1-y}Na_y)_{1-x}\}\{Nb_{1-z-w}Ta_zSb_w\}O_3$ where $0 \leq x \leq 0.2$, $0 \leq y \leq 1$, $0 \leq z \leq 0.4$, $0 \leq w \leq 0.2$, and $x+z+w>0$ are established. Herein, the specific crystal faces of grains constituting the polycrystalline substance are oriented.

In this case, a piezoelectric actuator that satisfies the requirements (a) to (e) or a piezoelectric actuator that satisfies the requirements (a) to (i) can be readily realized.

The grain-oriented piezoelectric ceramic has as a base composition potassium-sodium niobate $(K_{1-y}Na_yNbO_3)$ that is a kind of isotropic perovskite compound. The grain-oriented piezoelectric ceramic has a predetermined amount of lithium (Li) substituted for part of an A-site element (K or Na) and/or has a predetermined amount of tantalum (Ta) and/or antimony (Sb) substituted for part of a B-site element (Nb). In the above general formula, $x+z+w>0$ signifies that at least one of lithium (Li), tantalum (T), and antimony (Sb) should be contained as a substitutional element.

In the above general formula, y denotes the ratio of the potassium (K), contained in the grain-oriented piezoelectric ceramic, to the sodium (Na) contained therein. The grain-oriented piezoelectric ceramic employed in the present invention should contain at least one of K and Na as an A-site element. In other words, the ratio of K to Na, y, is not limited to any specific value but may be set to any value equal to or larger than 0 and equal to or smaller than 1. For an excellent displacement characteristic, the y value should preferably be equal to or larger than 0.05 and equal to or smaller than 0.75, more preferably, be equal to or larger than 0.20 and equal to or smaller than 0.70, more preferably, be equal to or larger than 0.35 and equal to or smaller than 0.65, more preferably, be equal to or larger than 0.40 and equal to or smaller than 0.60, or more preferably, be equal to or larger than 0.42 and equal to or smaller than 0.60.

By the way, x denotes an amount of lithium (Li) that is substituted for potassium (K) and/or sodium (Na) that is an A-site element. When Li is substituted for part of K and/or Na, the piezoelectric properties are improved, the Curie temperature is raised, and/or densification is facilitated. The x value should preferably be equal to or larger than 0 and equal to or smaller than 0.2. When the x value exceeds 0.2, the displacement characteristic is degraded. Preferably, the x value should be equal to or larger than 0 and equal to or smaller than 0.15. More preferably, the x value should be equal to or larger than 0 and equal to or smaller than 0.10.

Moreover, z denotes an amount of tantalum (Ta) that is substituted for niobium (Nb) which is a B-site element. When Ta is substituted for part of Nb, the displacement characteristic is improved. Specifically, the z value should preferably be equal to or larger than 0 and equal to or smaller than 0.4. If the z value exceeds 0.4, the Curie temperature falls. This makes it hard to use the piezoelectric ceramic as a piezoelectric material for home electric appliances or automobiles. The z value should preferably be equal to or larger than 0 and equal to or smaller than 0.35, or more preferably, be equal to or larger than 0 and equal to or smaller than 0.30.

Furthermore, w denotes an amount of antimony (Sb) that is substituted for niobium (Nb) which is a B-site element. If Sb is substituted for part of Nb, the displacement characteristic improves. Specifically, the w value should preferably be equal to or larger than 0 and equal to or smaller than 0.2. If the w value exceeds 0.2, the displacement characteristic is degraded and/or the Curie temperature falls. The w value should preferably be equal to or larger than 0 and equal to or smaller than 0.15.

As the temperatures of the grain-oriented piezoelectric ceramic change from high to low, the crystal phases thereof change from the cubic crystal to the tetragonal crystal (first crystal phase transition temperature=Curie temperature), from the tetragonal crystal to the orthorhombic crystal (second crystal phase transition temperature), or from the orthorhombic crystal to the rhombohedral crystal (third crystal phase transition temperature). At temperatures higher than the first crystal phase transition temperature, since the crystal phase is the cubic crystal, the displacement characteristic vanishes. Moreover, at temperatures lower than the second crystal phase transition temperature, the crystal phase is the orthorhombic crystal. Therefore, the temperature dependencies of a displacement and an apparent dynamic electrostatic capacitance respectively are increased. Consequently, the first crystal phase transition temperature is set to a value larger than a temperature range for use, and the second crystal phase transition temperature is set to a value smaller than the temperature range for use. Thus, the piezoelectric ceramic should preferably exist as the tetragonal crystal over the whole of the temperature range for use.

Regarding the potassium-sodium niobate ($K_{1-y}Na_yNbO_3$) that is the base composition of the grain-oriented piezoelectric ceramic, Journal of American Ceramic Society (U.S.A., 1959, Vol. 42[9], pp. 438-442) and the specification of U.S. Pat. No. 2,976,246 have disclosed that as the temperatures of $K_{1-y}Na_yNbO_3$ change from high to low, the crystal phases thereof change from the cubic crystal to the tetragonal crystal (first crystal phase transition temperature=Curie temperature), from the tetragonal crystal to the orthorhombic crystal (second crystal phase transition temperature), or from the orthorhombic crystal to the rhombohedral crystal (third crystal phase transition temperature). Moreover, when the y value is set to 0.5, the first crystal phase transition temperature is approximately 420° C., the second crystal phase transition temperature is approximately 190° C., and the third crystal phase transition temperature is approximately −150° C. Consequently, the temperature domain permitting the tetragonal crystal to exist is a range from 190° C. to 420° C. and is inconsistent with the temperature range for use of industrial products from −40° C. to 160° C.

On the other hand, the first and second crystal phase transition temperatures of a grain-oriented piezoelectric ceramic in accordance with the present invention may be freely varied by changing an amount of lithium (Li), tantalum (Ta), or antimony (Sb) which is a substitutional element to be substituted for other element contained in potassium-sodium niobate ($K_{1-y}Na_yNbO_3$) that is the basic composition of the grain-oriented piezoelectric ceramic.

Multiple regression analysis was performed on the amounts of substitutional lithium (Li), tantalum (Ta), and antimony (Sb) and the measured values of crystal phase transition temperatures with the y value set to a range from 0.4 to 0.6 permitting the piezoelectric properties to improve most greatly. The results are expressed by equations B1 and B2 below.

The equations B1 and B2 demonstrate that the increase in the amount of substitutional lithium (Li) causes the first crystal phase transition temperature to rise and causes the second crystal phase transition temperature to fall. Moreover, the increases in the amounts of substitutional tantalum (Ta) and antimony (Sb) cause both the first crystal phase transition temperature and the second crystal phase transition temperature to fall.

$$\text{First crystal phase transition temperature} = (388+9x-5z-17w)\pm 50 [° C.] \quad (B1)$$

$$\text{Second crystal phase transition temperature} = (190-18.9x-3.9z-5.8w)\pm 50 [° C.] \quad (B2)$$

The first crystal phase transition temperature is the temperature causing the piezoelectric properties to completely vanish. Moreover, a dynamic capacity abruptly increases at temperatures close to the first crystal phase transition temperature. The first crystal phase transition temperature should therefore preferably be equal to or higher than the sum of an upper-limit ambient temperature for use of industrial products and 60° C. The second crystal phase transition temperature is the temperature that brings about a crystal phase transition but does not cause the piezoelectric properties to vanish. The second crystal phase transition temperature should therefore be set to a value that does not adversely affect the temperature dependency of a displacement or a dynamic capacity, and preferably be equal to or smaller than the sum of a lower-limit ambient temperature for use of industrial products and 40° C.

By the way, the upper-limit ambient temperature for use of industrial products varies depending on usage and may therefore be 60° C., 80° C., 100° C., 120° C., 140° C., or 160° C. The lower-limit ambient temperature for use of industrial products may be −30° C. or −40° C.

Consequently, the first crystal phase transition temperature provided as the equation B1 should preferably be equal to or higher than 120° C. Therefore, the x, z, and w values should preferably satisfy the condition $(388+9x-5z-17w)+50 \geq 120$.

Moreover, the second crystal phase transition temperature provided as the equation B2 should preferably be equal to or lower than 10° C. Therefore, the x, z, and w values should preferably satisfy the condition $(190-18.9x-3.9z-5.8w)-50 \leq 10$.

In the grain-oriented piezoelectric ceramic, the x, y, and z values in the general formula $\{Li_x(k_{1-y}Na_y)_{1-x}\}\{Nb_{1-z-w}$ Ta$_z$Sb$_w$}O$_3$ should satisfy the relationships represented by the equations (3) and (4) below.

$$9x-5z-17w \geq -318 \qquad (3)$$

$$-18.9x-3.9z-5.8w \leq -130 \qquad (4)$$

The dynamic capacity (apparent dynamic capacity) is calculated by dividing an amount of charge Q [C], which is accumulated in a capacitor when a piezoelectric actuator and the capacitor are connected in series with each other and a voltage is applied to the piezoelectric actuator in order to drive the piezoelectric actuator under such a driving condition that the driving voltage shall have a constant amplitude in electric field strength of 100 V/mm or more, by the voltage V [V] applied to the piezoelectric actuator.

Incidentally, a grain-oriented piezoelectric ceramic in accordance with the present invention may be made only from the isotropic perovskite compound (first KNN-system compound) represented by the aforesaid general formula or may have another element actively added or substituted for any element.

In the former case, a grain-oriented piezoelectric ceramic should preferably be made only from the first KNN-system compound, but may contain any other element or phase as far as the isotropic perovskite crystal structure can be maintained but the sintering characteristic, piezoelectric properties, or the like will not be adversely affected. In particular, an impurity is inevitably mixed in a locally-procurable industrial raw material whose purity ranges from 99% to 99.9% and which is used to manufacture the grain-oriented piezoelectric ceramic. For example, niobium pentaoxide (Nb$_2$O$_5$) that is one of raw materials of the grain-oriented piezoelectric ceramic may contain at most 0.1 weight percent or less of tantalum (Ta) and 0.15 weight percent or less of fluorine (F) as impurities stemming from raw ores or a manufacturing method. Moreover, if bismuth (Bi) is used in a manufacturing process, mixing thereof in a raw material is inevitable as described in relation to the example 1 later.

In the latter case, addition of, for example, manganese (Mn) proves effective in decreasing the temperature dependency of an apparent dynamic capacity and in increasing a displacement. In addition, the addition of Mn proves effective in decreasing a dielectric loss tanδ and in increasing a mechanical quality factor Qm. Therefore, the addition of Mn provides a resonant drive type actuator with preferable characteristics.

Moreover, a grain-oriented piezoelectric ceramic has specific crystal faces of grains, which constitute a polycrystal whose main phase exists as an isotropic perovskite compound represented by the aforesaid general formula, oriented. Herein, the specific crystal faces of the grains that are oriented are preferably pseudo-cubic {100} planes.

Incidentally, the isotropic perovskite compound generally has a structure that is classified into the tetragonal crystal, orthorhombic crystal, trigonal crystal, or the like or that is slightly strained compared with the structure of the cubic crystal. Since the strain is negligible, the structure of the isotropic perovskite compound is regarded as the cubic crystal. Consequently, the pseudo-cubic {HKL} crystal refers to the tetragonal crystal, orthorhombic crystal, or trigonal crystal that is thus regarded as the cubic crystal, and is indicated with Miller indices.

In this case, a displacement made by the piezoelectric actuator can be increased, and the temperature dependency of an apparent dynamic capacity can be decreased.

When pseudo-cubic {100} planes are plane-oriented, the extent of plane orientation can be indicated with an average orientation degree F (HKL) calculated according to the Lotgering's method represented by the equation (1) below.

$$W_{D33}(\%) = [\{2 \times D33_{max}/(D33_{max}+D33_{min})\}-1] \times 100 \qquad (1)$$

In the equation (1), ΣI(hkl) denotes the sum total of X-ray diffraction intensities of all crystal faces (hkl) measured on a grain-oriented piezoelectric ceramic, and ΣI$_0$(hkl) denotes the sum total of X-ray diffraction intensities of all crystal faces (hkl) measured on a non-grain-oriented ceramic having the same composition as the grain-oriented piezoelectric ceramic. Moreover, ΣI'(HKL) denotes the sum total of X-ray diffraction intensities of specific crystal faces (HKL) that are crystallographically equivalent to one another and measured on the grain-oriented piezoelectric ceramic, and Σ'I$_0$(HKL) denotes the sum total of X-ray diffraction intensities of specific crystal faces (HKL) that are crystallographically equivalent to one another and measured on the non-grain-oriented ceramic having the same composition as the grain-oriented piezoelectric ceramic.

Consequently, when grains constituting a polycrystalline substance are not oriented at all, the average orientation degree F(HKL) is 0%. When the (HKL) planes of all grains constituting the polycrystalline substance are oriented in parallel to measured planes, the average orientation degree F(HKL) is 100%.

In general, the larger the ratio of oriented grains to all grains is, the more excellent characteristics the polycrystalline substance exhibits. For example, assuming that specific crystal faces are plane-oriented, if a polycrystalline substance is requested to exhibit the excellent piezoelectric properties, the average orientation degree F(HKL) calculated according to the Lotgering's method represented by the equation (1) should preferably be equal to or larger than 30%. More preferably, the average orientation degree F(HKL) should be equal to or larger than 50%. More preferably, the average orientation degree F(HKL) should be equal to or larger than 70%. Moreover, the specific crystal faces to be oriented should be planes perpendicular to a polarization axis. For example, if the crystal system of a perovskite compound is the tetragonal system, the specific crystal faces to be oriented should preferably be pseudo-cubic {100} planes.

The orientation degree of pseudo-cubic {100} planes contained in a grain-oriented piezoelectric ceramic, which is calculated according to the Lotgering's method, should preferably be 30% or more. Moreover, the crystal system of the grain-oriented piezoelectric ceramic should preferably be the tetragonal system over a temperature range from 10° C. to 160° C.

Incidentally, when specific crystal faces are axially oriented, the extent of orientation cannot be defined by the same orientation degree (equation (1)) as the one applied to plane orientation. However, when X-ray diffractions by planes perpendicular to an axis of orientation are measured, an average orientation degree (axial orientation degree) calculated according to the Lotgering's method and obtained based on the results of the diffractions by the (HKL) planes may be used to indicate an extent of axial orientation. Moreover, the axial orientation degree of a compact having specific crystal faces of grains thereof nearly perfectly axially oriented exhibits almost the same axial orientation degree as the one measured on a compact having specific crystal faces of grains thereof nearly perfectly plane-oriented.

As mentioned above, as far as a piezoelectric actuator in accordance with the present invention is concerned, when a piezoelectric ceramic employed satisfies the requirement (a), that is, when the bulk density of the piezoelectric ceramic is equal to or smaller than 5 g/cm$^3$, noise generated when the piezoelectric actuator is driven can be minimized. The piezoelectric ceramic satisfying the requirement (a) can be readily realized using a grain-oriented piezoelectric ceramic made from a compound represented by the aforesaid general formula.

To be more specific, the bulk density of a piezoelectric ceramic can be made equal to or smaller than 5.0 g/cm$^3$ by densifying a grain-oriented piezoelectric ceramic which is made from, for example, a compound represented by the aforesaid general formula so that the compound will exhibit a relative density of 95% or more.

In contrast, even when a lead zirconium titanate (PZT)-system material is densified, the bulk density thereof ranges from about 7.4 g/cm$^3$ to about 8.5 g/cm$^3$. Consequently, noise generated in an actuator employing the grain-oriented piezoelectric ceramic is less than noise generated in an actuator employing the PZT-system material.

Next, the resonant frequency of a piezoelectric actuator employing a grain-oriented piezoelectric ceramic will be described below. The Young's modulus Y11E of the grain-oriented piezoelectric ceramic employed in the present invention which is measured according to a resonance-antiresonance method is equal to or larger than 90 GPa. The resonant frequency of the piezoelectric actuator employing the grain-oriented piezoelectric ceramic is larger because the bulk density of the grain-oriented piezoelectric ceramic is small and the Young's modulus thereof is large.

Next, the heat radiation performance of a piezoelectric actuator employing a grain-oriented piezoelectric ceramic will be described below. The coefficient of thermal conductivity of the grain-oriented piezoelectric ceramic may be equal to or larger than 2 Wm$^{-1}$K$^{-1}$. Consequently, when the grain-oriented piezoelectric ceramic is employed, the requirement (b) can be readily satisfied. As a result, the heat radiation performance of the piezoelectric actuator is improved, and a rise in temperature can be suppressed.

Next, a thermal stress generated when a piezoelectric actuator employing a grain-oriented piezoelectric ceramic undergoes a change in temperature will be described below.

The coefficient of thermal expansion of a grain-oriented piezoelectric ceramic is equal to or larger than 3.0 ppm/° C. over a temperature range from −30° C. to 160° C. Therefore, the requirement (c) can be readily satisfied. As a result, a difference in the coefficient of thermal expansion between the grain-oriented piezoelectric ceramic and a holding member which is made of a metal or resin and whose coefficient of thermal expansion is larger than 3.0 ppm/° C. can be reduced. Consequently, a thermal stress generated when a piezoelectric actuator employing the grain-oriented piezoelectric ceramic undergoes a change in temperature can be reduced.

Next, the pyroelectric property of an actuator employing a grain-oriented piezoelectric ceramic will be described below. The pyroelectric coefficient of the grain-oriented piezoelectric ceramic is equal to or smaller than 400 μCm$^{-2}$K$^{-1}$ over a temperature range from −30° C. to 160° C. Therefore, the aforesaid requirement (d) is readily satisfied. As a result, a voltage developed at the terminals in the piezoelectric actuator employing the grain-oriented piezoelectric ceramic is so low as to realize a product that does not have the connection between the terminals short-circuited using a metallic clip jig or that does not have a resistor connected between the terminals.

Next, the mechanical strength of a piezoelectric actuator employing a grain-oriented piezoelectric ceramic will be described below. A biaxial bending breaking load the grain-oriented piezoelectric ceramic incurs is larger than that a PZT-system piezoelectric ceramic does. Consequently, the piezoelectric actuator employing the grain-oriented piezoelectric ceramic exhibits excellent mechanical strength and is therefore hardly broken.

Next, the mechanical quality factor QM of an actuator employing a grain-oriented piezoelectric ceramic will be described below. The mechanical quality factor QM of the grain-oriented piezoelectric ceramic is equal to or smaller than 30 at room temperature (25° C.). Consequently, the aforesaid requirement (e) can be readily realized. Since the mechanical quality factor Qm of an entire oscillatory system included in the piezoelectric actuator employing the grain-oriented piezoelectric ceramic can be decreased, the piezoelectric actuator permits realization of a piezoelectric acoustic part in which a difference in a sound pressure between a resonating point and any other point is limited.

Next, the displacement characteristic of a piezoelectric actuator employing a grain-oriented piezoelectric ceramic will be described below.

When a piezoelectric actuator uses a grain-oriented piezoelectric ceramic to realize a drive source, a magnitude of dynamic strain D33 occurring under such a driving condition that a driving voltage shall have a constant amplitude in electric field strength of 100 V/mm or more which does not cause a dielectric breakdown is equal to or larger than 250 pm/V over a temperature range from −30° C. to 160° C. Furthermore, if the composition of the ceramic and the manufacturing process thereof are optimized, the magnitude of dynamic strain D33 may be increased to be 300 pm/V or more, further to be 350 pm/V or more, further to be 400 pm/V or more, further to be 450 pm/V or more, or further to be 500 pm/V or more.

Moreover, the width of variation in a displacement (=the width of variation in a magnitude of dynamic strain) may fall within ±14% or less with the quotient of (a maximum value−a minimum value) by 2 as a reference value. If the composition of the ceramic and the manufacturing process thereof are optimized, the width of variation in a displacement may be decreased to fall within ±12% or less, further to fall within ±10% or less, or further to fall within ±8% or less.

Moreover, over a temperature range from −30° C. to 80° C., the width of variation in a displacement (=the width of variation in a magnitude of dynamic strain) occurring under such a driving condition that a driving voltage shall have a constant amplitude in electric field strength of 100 V/mm or more may fall within ±14% or less with the quotient of (a maximum value−a minimum value) by 2 as a reference value. If the composition of the ceramic and the manufacturing process thereof are optimized, the width of variation in a displacement may be decreased to fall within ±12% or less, further to fall within ±9% or less, further to fall within ±7% or less, further to fall within ±5% or less, or further to fall within ±4% or less. This results in an actuator that, when driven according to a constant-voltage driving method, has a displacement which is hardly temperature-dependent.

A piezoelectric actuator in accordance with the present invention may have the entire displacement source thereof made from a grain-oriented piezoelectric ceramic. A piezoelectric ceramic expressed by the general formula (1) and any other piezoelectric ceramic may be combined to such an extent that the displacement characteristic of a piezoelectric actuator will not be adversely affected, whereby a piezoelectric actuator may be constructed. For example, in the case of a laminated actuator, the grain-oriented piezoelectric ceramic expressed by the general formula (1) may occupy 50% or more of the volume of a piezoelectric ceramic, and a barium titanate-system piezoelectric ceramic may occupy the remaining percentage of less than 50%.

Figure 15:
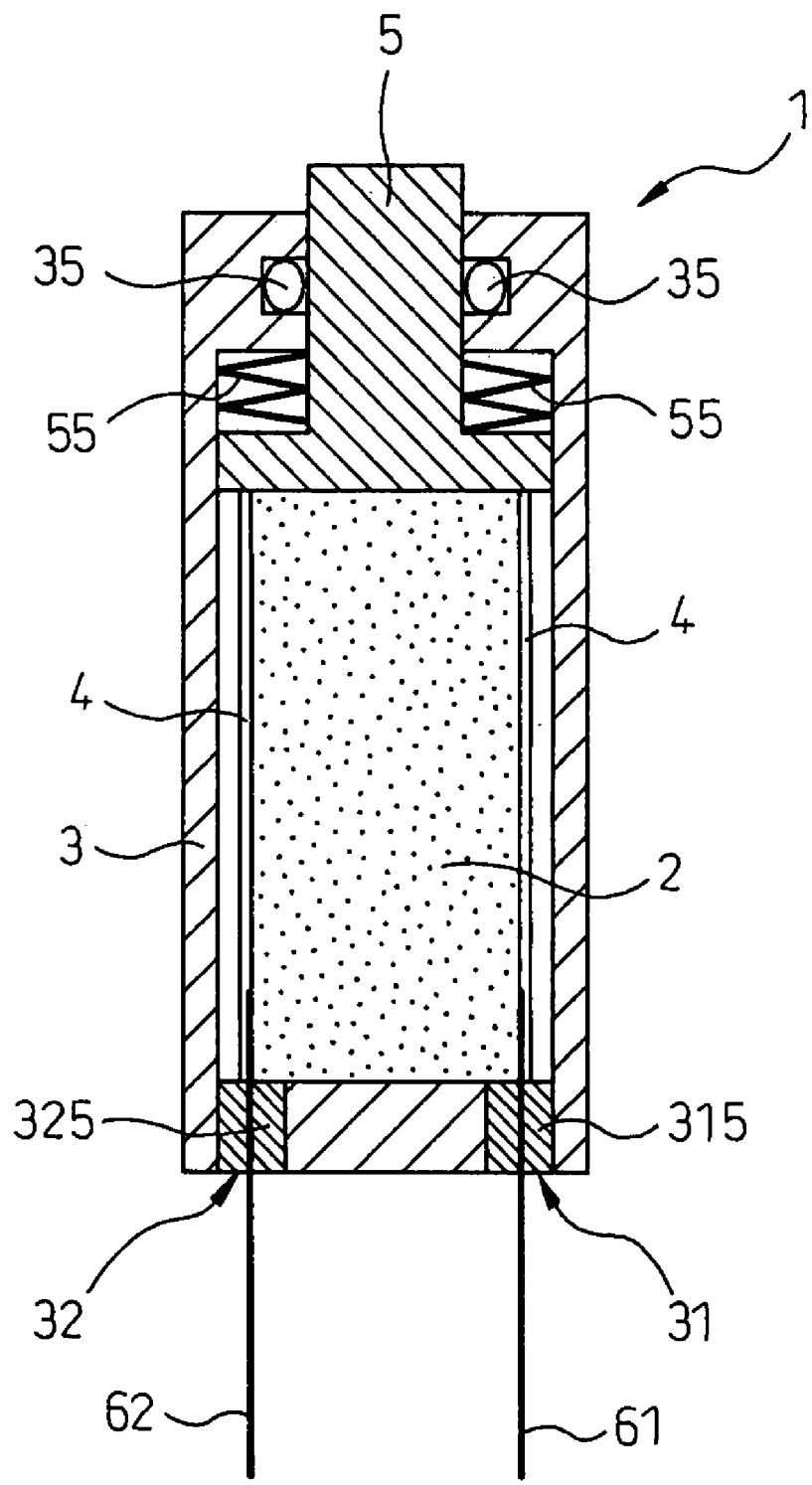
FIG. 15 is an explanatory diagram showing an example of the structure of a piezoelectric actuator in accordance with the present invention.

An example of the structure of a piezoelectric actuator in accordance with the present invention will be described in conjunction with FIG. 15. As shown in FIG. 15, a piezoelectric actuator 1 includes a piezoelectric element 2 having a sheet of piezoelectric ceramic, a holding member 4 that holds the piezoelectric element, a housing member 3 that accommodates the piezoelectric element and others, and a conveying member 5 that conveys a displacement made by the piezoelectric element.

Figure 17:
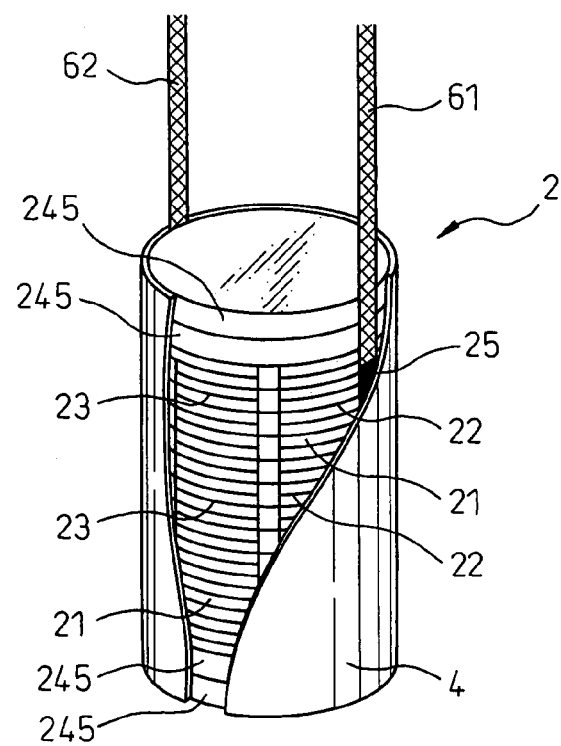
FIG. 17 is an explanatory diagram showing the structure of a laminated piezoelectric element in accordance with the example 1.

As shown in FIG. 17 that will be referenced later, a laminated piezoelectric element having sheets of piezoelectric ceramic 21 and internal electrodes 22 and 23 alternately stacked may be adopted as the piezoelectric element 2.

Moreover, a veneer piezoelectric element having one sheet of piezoelectric ceramic sandwiched between two internal electrodes (not shown) may be adopted as the piezoelectric element 2.

A pair of external electrodes 25 and 26 is formed on the flanks of the piezoelectric element 2. Two adjoining internal electrodes 22 and 23 in the piezoelectric element 2 is electrically connected to the external electrodes 25 and 26 respectively.

As shown in FIG. 15, the conveying member 5 such as a piston is disposed at one end in a stacking direction of the piezoelectric element 2 included in the piezoelectric actuator 1. A disk spring 55 is put in a space between the housing 3 and the conveying member 5, whereby a preset load is imposed on the piezoelectric element 2. The conveying member 5 is movable along with a displacement of the piezoelectric element 2, and can thus convey the displacement to outside. Moreover, the housing 3 has through holes 31 and 32. Terminals (leads) 61 and 62 via which a charge is supplied externally are inserted into the through holes 31 and 32 respectively. Grommets 31 and 32 are used to keep the inside of the housing 3 airtight. The terminals 61 and 62 are electrically connected to the external terminals 25 and 26 respectively formed on the piezoelectric element 2.

As shown in FIG. 15, an O ring 35 is put in a space between the piston member 5 and the housing 3 in order to keep the inside of the housing 3 airtight. Moreover, the O ring 35 permits the piston member 5 to stretch or contract.

The piezoelectric actuator may be adapted to, for example, a fuel injection valve. Moreover, the piezoelectric actuator may be adopted as a laminated actuator, a piezoelectric transformer, an ultrasonic motor, a bimorph cell, a sonar, a piezoelectric ultrasonic transducer, a piezoelectric buzzer, or a piezoelectric loudspeaker.

EXAMPLE 1

In the present example, a piezoelectric element including a sheet of piezoelectric ceramic is produced, and used to fabricate a piezoelectric actuator.

Figure 16:
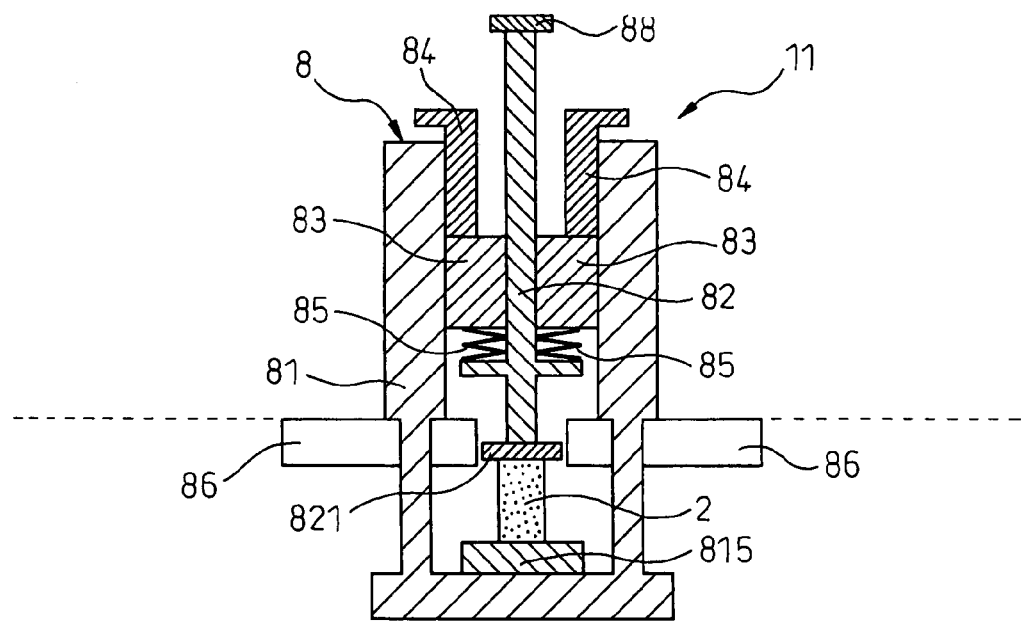
FIG. 16 is an explanatory diagram schematically showing the structure of the piezoelectric actuator in accordance with the example 1.

In the present example, a piezoelectric actuator 11 including a jig 8 is, as shown in FIG. 16, fabricated as a model of a piezoelectric actuator.

Specifically, the piezoelectric actuator 11 of the present example includes a laminated piezoelectric element 2 that uses sheets of piezoelectric ceramic as a drive source, and has the piezoelectric element 2 locked in the jig 8.

The jig 8 includes a housing 81 that accommodates the piezoelectric element 2 and a piston (coupling member) 82 that is coupled to the piezoelectric element 2 and conveys a displacement of the piezoelectric element 2. The piston 82 is coupled to a guide 83 via a disk spring 85. A pedestal 815 is formed in the housing 81, and the piezoelectric element 2 is placed on the pedestal 815. The piezoelectric element 2 placed on the pedestal 815 is secured by a head 821 of the piston 82. At this time, a presetting load may be imposed on the piezoelectric element 2 by the disk spring 85. Moreover, an end (measuring member 88) of the piston 82 opposite to the head 821 thereof can be moved along with the displacement of the piezoelectric element 2.

Now, a method of applying a presetting load will be described below. The presetting load is imposed by inserting a cylindrical push rod (not shown) into a gap between the piston 82 and a push screw 84 and applying an accurate load to the guide 83 using an Amsler type testing machine. Thereafter, for sustainment of the presetting load, the push screw 84 and housing 81 are secured with the load applied. Thereafter, the push rod is removed.

In the present example, the reason why the model of a piezoelectric actuator is fabricated is to evaluate the temperature characteristic of a displacement made by the piezoelectric actuator. As the piezoelectric actuator is elongated, the piezoelectric element 2 can be put in a thermostat and the measuring member 88 can be disposed outside the thermostat (at room temperature). For evaluation of the temperature characteristic that will be described later, the portion of the piezoelectric actuator 11 shown below a dashed line in FIG. 16 is put in the thermostat. An adiabatic member 86 is included in the piezoelectric actuator in order to prevent thermal transfer to the portion of the piezoelectric actuator which is shown above the dashed line in the drawing. The model of a piezoelectric actuator is functionally equivalent to the piezoelectric actuator shown in FIG. 15.

As shown in FIG. 17, in the present example, the piezoelectric element 2 is a laminated piezoelectric element having the sheets of piezoelectric ceramic 21 and internal electrodes 22 and 23 alternately stacked. Moreover, an alumina plate 245 is placed on both the ends of the piezoelectric element 2 in a stacking direction.

The two external electrodes 25 and 26 are formed on the flanks of the piezoelectric element 2 as if to sandwich the piezoelectric element. The external electrodes 25 and 26 are connected to the leads 61 and 62 respectively.

The internal electrodes 22 and 23 and the external electrodes 25 and 26 are electrically connected to one another so that two adjoining internal electrodes 22 and 23 in the piezoelectric element 2 will be connected to the external electrodes 25 and 26 respectively of mutually different potentials.

Next, a method of manufacturing the piezoelectric actuator of the present example will be described below.

(1) Preparing a Sodium Niobate ($NaNbO_3$) Plate-like Powder

A dibismuth trioxide ($Bi_2O_3$) powder, a sodium carbonate ($Na_2CO_3$) powder, and a diniobium pentaoxide ($Nb_2O_5$) powder were weighed in units of $g/m^2$ according to a composition expressed as $Bi_{2.5}Na_{3.5}Nb_5O_{18}$ using a stoichiometric ratio. The powders were then wet-blended. Thereafter, 50 weight percent of sodium chloride (NaCl) was added as a flux to the raw material, and the mixture was dry-blended for one hour.

Thereafter, the mixture was poured into a platinum crucible, and heated at 850° C. for one hour. After the flux was completely dissolved, the mixture was heated at 1100° C. for two hours. Thus, a reactant expressed as $Bi_{2.5}Na_{3.5}Nb_5O_{18}$ was prepared. Incidentally, the temperature raising rate was 200° C. per hour, and furnace cooling was adopted as a cooling method. After the completion of the cooling, the flux was removed by bathing the reactant in hot water. This resulted in a $Bi_{2.5}Na_{3.5}Nb_5O_{18}$ powder. The resultant $Bi_{2.5}Na_{3.5}Nb_5O_{18}$ powder was a plate-like powder having {001} planes of grains thereof as developed planes.

Thereafter, an amount of sodium carbonate ($Na_2CO_3$) needed to prepare sodium niobate ($NaNbO_3$) was mixed in the $Bi_{2.5}Na_{3.5}Nb_5O_{18}$ plate-like powder. Sodium chloride (NaCl) was used as a flux, and the mixture was thermally treated in the platinum crucible at 950° C. for eight hours.

The resultant reactant contained dibismuth trioxide ($Bi_2O_3$) as well as the $NaNbO_3$ powder. After the flux was removed from the reactant, the reactant was put in 1N nitric acid ($HNO_3$) in order to dissolve the $Bi_2O_3$ produced as a surplus component. Furthermore, the solution was filtered in order to dissociate the sodium niobate ($NaNbO_3$) powder, and the $NaNbO_3$ powder was cleansed with ion-exchanged water at 80° C. The resultant $NaNbO_3$ powder was a plate-like powder having pseudo-cubic {100} planes of grains thereof as developed planes. The diameter of a grain ranged from 10 μm to 30 μm, and the aspect ratio thereof ranged from about 10 to about 20.

(2) Producing a Grain-oriented Ceramic having the Composition Expressed as $\{Li_{0.07}(K_{0.43}Na_{0.57})_{0.93}\}\{Nb_{0.84}Ta_{0.09}Sb_{0.07}\}O_3$ A sodium carbonate ($Na_2CO_3$) powder, a potassium carbonate ($K_2CO_3$) powder, a lithium carbonate ($Li_2CO_3$) powder, a diniobium pentaoxide ($Nb_2O_5$) powder, a ditantalum pentaoxide ($Ta_2O_5$) powder, and a diantimony pentaoxide ($Sb_2O_5$) powder that have the purity of 99.99% or more were weighed in the unit of $g/m^2$ according to the stoichiometric composition expressed as $\{Li_{0.07}(K_{0.43}Na_{0.57})_{0.93}\}\{Nb_{0.84}Ta_{0.09}Sb_{0.07}\}O_3$ in order to prepare one mol of a mixture having 0.05 mol of sodium niobate ($NaNbO_3$) subtracted therefrom. Using an organic solvent as a medium, the mixture was wet-blended in a zirconium (Zr) bowl for twenty hours. Thereafter, the mixture was calcinated at 750° C. for five hours. Using an organic solvent as a medium, the mixture was wet-pulverized in the Zr bowl for twenty hours. This resulted in a calcinated powder whose mean grain diameter was approximately 0.5 μm.

In order to realize the composition $\{Li_{0.07}(K_{0.43}Na_{0.57})_{0.93}\}\{Nb_{0.84}Ta_{0.09}Sb_{0.07}\}O_3$, the calcinated powder and the plate-like sodium niobate ($NaNbO_3$) were weighed in units of $g/m^2$ so that the ratio of the calcinated power to $NaNbO_3$ would be 0.95 mol to 0.05 mol. Using an organic solvent as a medium, the mixture was wet-blended in the zirconium (Zr) bowl for twenty hours. This resulted in a pulverized slurry. Thereafter, a binder (polyvinyl butyral) and a plasticizer (dibutyl phthalate) were added to the slurry, and the slurry was blended for two hours.

Thereafter, tape molding equipment was used to mold the blended slurry into a tape of approximately 100 μm thick. Furthermore, the tape was folded or crimped and rolled. This resulted in a plate-like compact of 1.5 mm thick. Thereafter, the plate-like compact was degreased in air under such conditions that the heating temperature should be 600° C., the heating time should be five hours, the temperature raising rate should be 50° C. per hour, and the cooling rate should be a furnace cooling rate. Furthermore, the degreased plate-like compact was molded according to the cold isostatic press (CIP) method under the pressure of 300 MPa, and then sintered in oxygen at 1110° C. for five hours. Thus, a piezoelectric ceramic (grain-oriented piezoelectric ceramic) was produced.

The sintered-compact density of the produced piezoelectric ceramic was calculated, and the average orientation degree F(100) of pseudo-cubic {100} planes of grains parallel to the tape surface was calculated according to the Lotgering's method expressed by the aforesaid equation (1).

Figure 18:
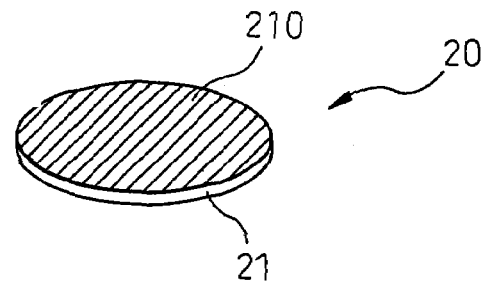
FIG. 18 is an explanatory diagram showing the structure of a piezoelectric element (veneer) formed with a sheet of piezoelectric ceramic according to the example 1.

Furthermore, the produced piezoelectric ceramic was ground, polished, and machined in order to produce a sheet of piezoelectric ceramic 21 that was, as shown in FIG. 18, a disk-like specimen, 0.485 mm thick and 11 mm in diameter, whose upper and lower surfaces are parallel to the tape surface. A gold (Au) burning electrode paste (ALP 3057 by Sumitomo Metal Mining Co., Ltd.) was printed on the upper and lower surfaces of the specimen, and then dried up. Thereafter, a meshed belt sintering furnace was used to burn the specimen at 850° C. for ten min. Thus, an electrode 210 of 0.01 mm thick was formed on the sheet of piezoelectric ceramic 21. Furthermore, the disk-like specimen was cylindrically ground to have a diameter 8.5 mm. This was intended to remove a boss of several micrometers in size which was inevitably formed on the perimeter of the electrode during printing. Thereafter, the specimen was polarized vertically. This resulted in a piezoelectric element (veneer) 20 having a whole-surface electrode 210 formed on the sheet of piezoelectric ceramic 21.

A resonant frequency (Fr) and piezoelectric properties, that is, a Young's modulus (Y11E), a piezoelectric strain constant ($d_{31}$), an electromechanical coupling coefficient (kp), a mechanical quality factor (Qm), a dielectric constant ($\epsilon_{33}^1/\epsilon_0$) that was a dielectric property, and a dielectric loss (tanδ) were measured on the produced piezoelectric element 20 at room temperature (25° C.) according to a resonance-antiresonance method. Moreover, an apparent density, an open porosity, and a bulk density were measured on the sintered compact, on which an electrode had not yet been formed, according to an Archimedes' method.

Moreover, the first crystal phase transition temperature (Curie temperature) and second crystal phase transition temperature were obtained by measuring the temperature characteristic of the dielectric constant. Incidentally, when the second crystal phase transition temperature was equal to or lower than 0° C., the width of variation in the dielectric constant observed at the temperatures higher than the second crystal phase transition temperature was very small. Therefore, if the peak position of the dielectric constant could not be identified, the temperature causing the dielectric constant to abruptly change was regarded as the second crystal phase transition temperature.

Thereafter, the produced piezoelectric element was used to fabricate a laminated piezoelectric element, and the laminated piezoelectric element was used to construct a piezoelectric actuator. The piezoelectric actuator was then evaluated.

Figure 19:
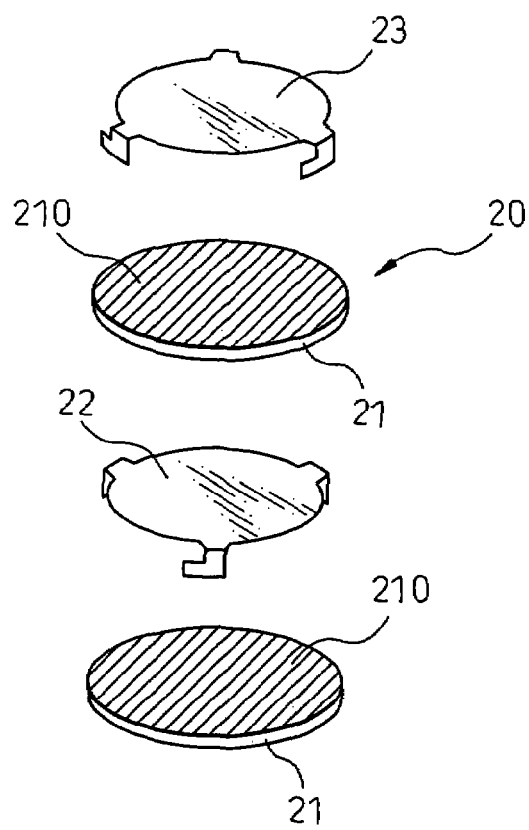
FIG. 19 is an explanatory diagram showing how to stack piezoelectric elements (veneers) and internal electrode plates according to the example 1.

As shown in FIG. 19, piezoelectric elements 20 produced as mentioned above and internal electrode plates 22 (23) that were made of stainless used steel (SUS), had a thickness of 0.02 mm and a diameter of 8.4 mm, and included projections via which each internal electrode plate was connected to an external electrode which will be described later were alternately stacked. At that time, the internal electrode plates 22 (23) were disposed so that the projections thereof would be extended in a stacking direction from alternately different positions and would be aligned with those of every other layer. Thus, forty sheets of piezoelectric ceramic 21 and forty-one internal electrode plates 22 (23) were alternately stacked one another. An alumina plate (insulating plate) of 2 mm thick and 8.5 mm in diameter was stacked on the upper and lower surfaces of the laminated body, whereby the laminated piezoelectric element 2 was produced as shown in FIG. 17.

Thereafter, strip-shaped external electrodes 25 and 26 made of stainless used steel (SUS) were welded to the projections of the internal electrode plates 22 and 23 so that the piezoelectric elements would be electrically connected in parallel to one another. Furthermore, leads 61 and 62 were procured and electrically connected to the external electrodes 25 and 26 respectively.

Moreover, a comb-like resin insulating member (not shown) was inserted to gaps, which are created by the identical electrode plates and opened onto the flanks of the laminated body, in order to ensure the isolation among the projections of the internal electrode plates 22 and 23, the internal electrode plates 22 and 23 of opposite polarities, and the gold (Au) electrodes of opposite polarities on the piezoelectric elements. A silicone grease was applied to the laminated body, and the laminated body was then sheathed with a holding member 4 realized with an insulating tube. This resulted in the laminated piezoelectric element 2.

Thereafter, a compressive stress of 150 MPa was applied to the laminated piezoelectric element 2 in the stacking direction at room temperature (25° C.) for thirty sec for the purpose of improving the adhesion among the gold (Au) electrodes included in the laminated piezoelectric element 2 and the electrode plates included therein (pressurized aging). Furthermore, while a compressive stress of 30 Mpa was applied in the stacking direction at room temperature (25° C.), a sine wave having an amplitude in electric field strength of 1500 V/mm from zero was applied at a frequency of 40 Hz for thirty min (voltage aging). Thereafter, as shown in FIG. 16, the laminated piezoelectric element 2 was locked in the Jig 8. The disk spring 85 whose spring constant was 2.9 N/μm was pressure-welded in the stacking direction of the piezoelectric element 2 by imposing a presetting load of 16.4 MPa. Thus, a piezoelectric actuator 11 was completed as shown in FIG. 16.

Thereafter, the piezoelectric actuator was driven with an applied voltage that alternates from 485 V through 728 V to 970 V because it was a trapezoidal wave of a constant amplitude (in electric field strength of 1000 V/mm from zero, 1500 V/mm from zero, or 2000 V/mm from zero). The temperature dependency of a magnitude of dynamic strain D33 was measured over a temperature range from −40° C. to 160° C.

For the measurement of a magnitude of dynamic strain D33, an electrostatic capacitance type displacement sensor was used to measure a displacement under such driving conditions that a driving voltage of a trapezoidal wave should have frequencies of 0.5 Hz and 10 Hz, require 150 μs as a rise time and a fall time alike, and exhibit a duty factor of 50 to 50. The magnitude of dynamic strain D33 was then calculated according to the equation A2.

Moreover, the calculated values were used to obtain the width of variation in the magnitude of dynamic strain D33 over a temperature range from −30° C. to 80° C. and the width of variation therein over a temperature range from −30° C. to 160° C. Herein, the widths of variations were obtained with the quotient of (a maximum value−a minimum value) by 2 as a reference value.

A piezoelectric ceramic (grain-oriented ceramic) produced in the present example was so highly densified that the bulk density thereof was 4.72 g/cm³. Moreover, the pseudo-cubic {100} planes of grains were oriented in parallel to the tape surface, and the average orientation degree of the pseudo-cubic {100} planes measured according to the Lotgering's method reached 88.5%.

The results of evaluation of the piezoelectric properties observed at room temperature (25° C.) were such that the resonant frequency Fr was 376 kHz, the Young's modulus $Y_{11}^E$ was 103.0 GPa, the piezoelectric strain constant $d_{31}$ was 86.5 pm/V, the electromechanical coupling coefficient kp was 48.8%, the mechanical quality factor Qm was 18.2, the dielectric constant $\epsilon_{33}^t/\epsilon_0$ was 1042, and the dielectric loss tanδ was 6.4%. Moreover, the first crystal phase transition temperature (Curie temperature) calculated based on the temperature characteristic of the dielectric constant was 282° C., and the second crystal phase transition temperature was −30° C. Table 1 lists these results.

Table 2, FIG. 1, and Table 7 present the temperature characteristic of a magnitude of dynamic strain D33 measured with the driving frequency for the piezoelectric actuator produced in the present example set to 0.5 Hz.

Over a temperature range from −30° C. to 80° C., the minimum value of a magnitude of dynamic strain D33 is 303 pm/V and is observed when the amplitude in driving electric field strength is 1000 V/mm and the temperature is −30° C. The maximum value of the width of variation in the magnitude of dynamic strain D33 is ±3.8% and is observed when the amplitude in driving electric field strength is 1500 V/mm.

Over a temperature range from −30° C. to 160° C., the minimum value of a magnitude of dynamic strain D33 is 303 pm/V and is observed when the amplitude in driving electric field strength is 1000 V/mm and the temperature is −30° C. The maximum value of the width of variation in the magnitude of dynamic strain D33 is ±7.7% and is observed when the amplitude in driving electric field strength is 2000 V/mm.

EXAMPLE 2

A grain-oriented ceramic having the composition of $\{Li_{0.07}(K_{0.45}Na_{0.55})_{0.93}\}\{Nb_{0.82}Ta_{0.01}Sb_{0.08}\}O_3$ was produced according to the same procedure as the one employed in the example 1 except that the burning temperature for a degreased plate-like compact was set to 1105° C. The produced grain-oriented ceramic was evaluated relative to the density of a sintered compact, an average orientation degree, and piezoelectric properties under the same conditions as those defined in the example 1. Moreover, a laminated actuator including forty sheets of piezoelectric ceramic was fabricated according to the same procedure as that employed in the example 1, and the characteristics of the actuator were evaluated.

The grain-oriented ceramic produced in the present example was so highly densified that the bulk density thereof was 4.72 g/cm³. Moreover, the pseudo-cubic {100} planes of grains were oriented in parallel to the tape surface. The average orientation degree of the pseudo-cubic {100} planes calculated according to the Lotgering's method reached 94.6%. Furthermore, the results of the evaluation of the piezoelectric properties observed at room temperature (25° C.) were such that the resonant frequency F4 was 374 kHz, the Young's modulus $Y_{11}^E$ was 102.5 GPa, the piezoelectric strain constant $d_{31}$ was 88.1 pm/V, the electromechanical coupling coefficient kp was 48.9%, the mechanical quality factor Qm was 16.6, the dielectric constant $\epsilon_{33}^t/\epsilon_0$ was 1071, and the dielectric loss tanδ was 4.7%. Moreover, the first crystal phase transition temperature (Curie temperature) obtained based on the temperature characteristic of the dielectric constant was 256° C., and the second crystal phase transition temperature was −35° C.

Table 1 lists the above results.

Figure 2:
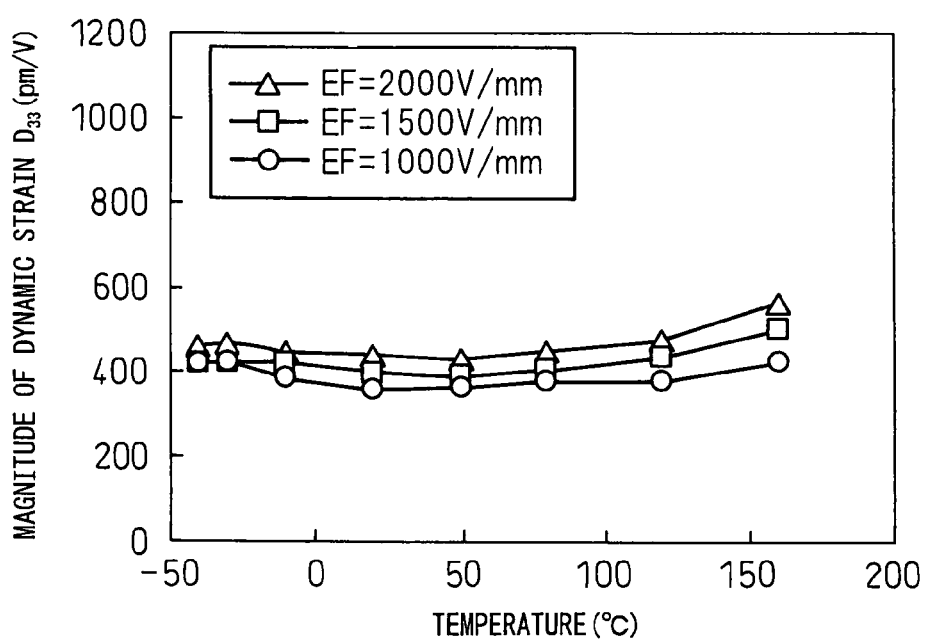
FIG. 2 is a graph showing the temperature dependency of a magnitude of dynamic strain D33 exhibited by a piezoelectric actuator in accordance with an example 2.

Table 3, FIG. 2, and Table 7 present the temperature characteristic of a magnitude of dynamic strain D33 measured with the driving frequency for the piezoelectric actuator, which is produced in the present embodiment, set to 0.5 Hz.

As seen from the tables and drawing, over a temperature range from −30° C. to 80° C., the minimum value of a magnitude of dynamic strain D33 is 355 pm/V and is observed when the amplitude in driving electric field strength is 1000 V/mm and the temperature is 20° C. The maximum value of the width of variation in the magnitude of dynamic strain D33 is ±8.0% and is observed when the amplitude in driving electric field strength is 1000 V/mm.

Over a temperature range from −30° C. to 160° C., the minimum value of a magnitude of dynamic strain D33 is 355 pm/V and is observed when the amplitude in driving electric field strength is 1000 V/mm and the temperature is 20° C. The maximum value of the width of variation in the magnitude of dynamic strain D33 is ±13.8% and is observed when the amplitude in driving electric field strength is 2000 V/mm.

EXAMPLE 3

A grain-oriented ceramic having the composition of $\{Li_{0.65}(K_{0.45}Na_{0.55})_{0.935}\}\{Nb_{0.83}Ta_{0.09}Sb_{0.08}\}O_3$ was produced according to the same procedure as the one employed in the example 1 except that the burning temperature for a degreased plate-like compact was set to 1105° C. The produced grain-oriented ceramic was evaluated relative to the density of a sintered body, an average orientation degree, and piezoelectric properties under the same conditions as those specified in the example 1. Moreover, a laminated actuator including forty sheets of piezoelectric ceramic was fabricated according to the same procedure as that employed in the example 1, and the characteristics of the actuator were evaluated.

The grain-oriented ceramic produced in the present example was so highly densified that the bulk density was 4.71 g/cm$^3$. Moreover, the pseudo-cubic $\{100\}$ planes of grains were oriented in parallel with the tape surface, and the average orientation degree of the pseudo-cubic $\{100\}$ planes calculated according to the Lotgering's method reached 93.9%. Furthermore, the results of evaluation of the piezoelectric properties observed at room temperature (25° C.) were such that the resonant frequency Fr was 371 kHz, the Young's modulus $Y_{11}^E$ was 100.2 GPa, the piezoelectric strain constant $d_{31}$ was 95.2 pm/V, the electromechanical coupling coefficient kp was 50.4%, the mechanical quality factor Qm was 15.9, the dielectric constant $\epsilon_{33}^T/\epsilon_0$ was 1155, and the dielectric loss tanδ was 5.2%. Moreover, the first crystal phase transition temperature (Curie temperature) obtained based on the temperature characteristic of the dielectric constant was 261° C., and the second crystal phase transition temperature was −12° C. Table 1 lists these results.

Figure 3:
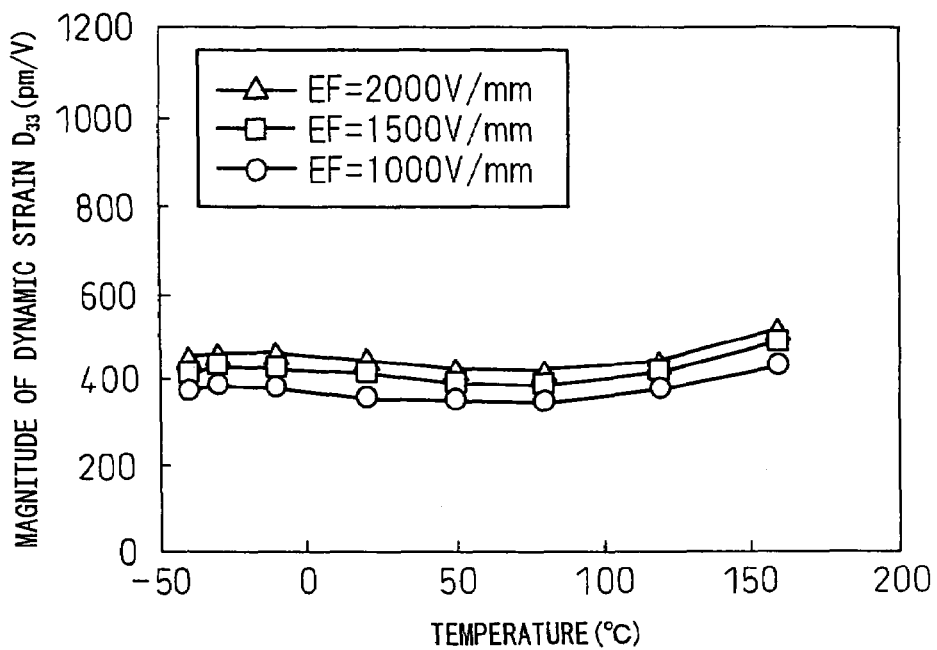
FIG. 3 is a graph showing the temperature dependency of a magnitude of dynamic strain D33 exhibited by a piezoelectric actuator in accordance with an example 3.

Table 4, FIG. 3, and Table 7 present the temperature characteristic of a magnitude of dynamic strain D33 measured with the driving frequency for the actuator, which is fabricated in the present example, set to 0.5 Hz.

As seen from the tables and drawing, over a temperature range from −30° C. to 80° C., the minimum value of a magnitude of dynamic strain D33 is 347 pm/V and is observed when the amplitude in driving electric field strength is 1000 V/mm and the temperature is 80° C. The maximum value of the width of variation in the magnitude of dynamic strain D33 is ±5.6% and is observed when the amplitude in driving electric field strength is 1500 V/mm.

Over a temperature range from −30° C. to 160° C., the minimum value of a magnitude of dynamic strain D33 is 347 pm/V and is observed when the amplitude in driving electric field strength is 1000 V/mm and the temperature is 80° C. The maximum value of the width of variation in the magnitude of dynamic strain D33 is ±11.5% and is observed when the amplitude in driving electric field strength is 1500 V/mm.

EXAMPLE 4

In the present example, a grain-oriented piezoelectric ceramic having the same composition as the example 1 was produced according to a procedure different from the one for the example 1.

Specifically, a plate-like sodium niobate (NaNbO$_3$) powder, a non-plate-like NaNbO$_3$ powder, a potassium niobate (KNbO$_3$) powder, a potassium tantalite (KTaO$_3$) powder, a lithium antimonite (LiSbO$_3$) powder, and a sodium antimonite (NaSbO$_3$) powder were weighed in the unit of g/m$^2$ according to the composition of $\{Li_{0.07}(K_{0.43}Na_{0.57})_{0.93}\}\{Nb_{0.84}Ta_{0.09}Sb_{0.07}\}O_3$. Using an organic solvent as a medium, the powders were wet-blended for twenty hours.

After a binder (polyvinyl butyral) and a plasticizer (dibutyl phthalate) were added to the slurry, the resultant slurry was blended for two more hours.

Incidentally, the proportion of the sodium niobate (NaNbO$_3$) plate-like powder was determined so that 5 weight percent of an A-site element that was the first KNN-system solid solution (ABO$_3$) prepared from starting materials could be supplied from the NaNbO$_3$ plate-like powder. Moreover, the non-plate-like NaNaO$_3$ powder, KNbO$_3$ powder, KTaO$_3$ powder, LiSbO$_3$ powder, and NaSbO$_3$ powder were produced according to a solid phase method. Namely, a mixture that contains predetermined amounts of a potassium carbonate (K$_2$CO$_3$) powder, a sodium carbonate (Na$_2$CO$_3$) powder, a diniobium pentaoxide (Nb$_2$O$_5$) powder, a ditantalum pentaoxide (Ta$_2$O$_5$) powder, and/or a diantimony pentaoxide (Sb$_2$O$_5$) powder, which have a purity of 99.9%, was heated at 750° C. for five hours. The reactant was then pulverized using a ball mill.

Thereafter, tape molding equipment was used to mold the blended slurry into a tape having a thickness of approximately 100 μm. Furthermore, the tape was folded or crimped and rolled in order to produce a plate-like compact having a thickness of 1.5 mm. Thereafter, the plate-like compact was degreased in air under such conditions that the heating temperature was 600° C., the heating time was five hours, the temperature raising rate was 50° C. per hour, and the cooling rate was a rate of furnace cooling. Furthermore, the degreased plate-like compact was molded according to the cold isostatic press (CIP) method under a pressure of 300 MPa. Thereafter, the plate-like compact was sintered using a hot press, which applied a pressure of 35 kg/cm2 (3.42 MPa) during heating, under such conditions that the burning temperature was 1130° C., the heating time was five hours, and the temperature raising or lowering rate was 200° C. per hour. Thus, a piezoelectric ceramic (grain-oriented piezoelectric ceramic) was produced.

The grain-oriented ceramic produced in the present example was so highly densified that the bulk density thereof was 4.78 g/cm$^3$. Moreover, the pseudo-cubic $\{100\}$ planes of grains were oriented in parallel to the tape surface.

The average orientation degree of the pseudo-cubic {100} planes calculated according to the Lotgering's method reached 96%. Furthermore, the results of evaluation of the piezoelectric properties observed at room temperature (25° C.) were such that the resonant frequency Fr was 362 kHz, the Young's modulus $Y_{11}^E$ was 96.6 Gpa, the piezoelectric strain constant $d_{31}$ was 96.5 pm/V, the electromechanical coupling coefficient kp was 51.9%, the mechanical quality factor Qm was 15.2, the dielectric constant $\epsilon_{33}{}^t/\epsilon_0$ was 1079, and the dielectric loss tanδ was 4.7%. Moreover, the first crystal phase transition temperature (Curie temperature) obtained based on the temperature characteristic of the dielectric constant was 279° C., and the second crystal phase transition temperature was −28° C. Table 1 lists these results.

Figure 4:
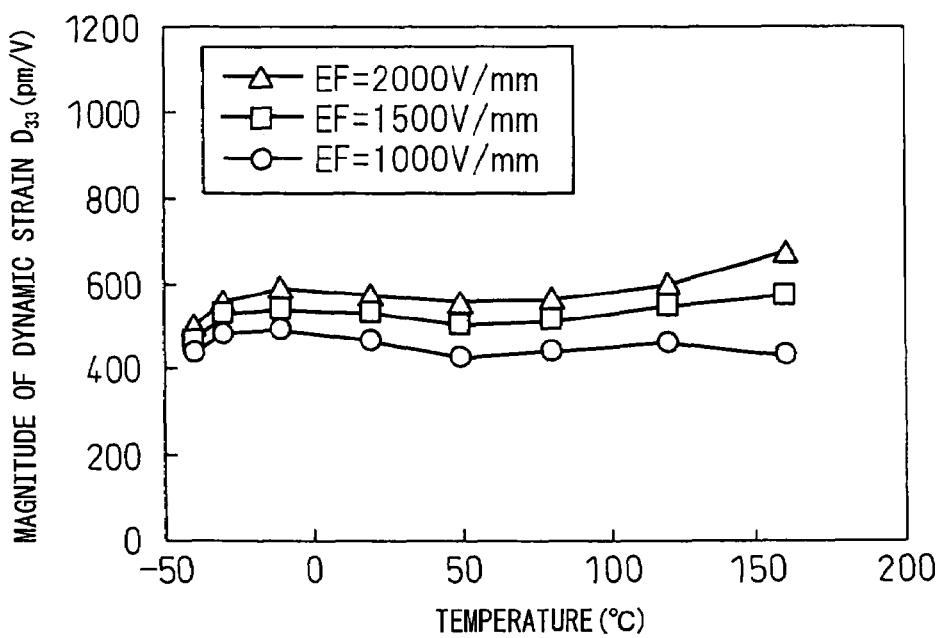
FIG. 4 is a graph showing the temperature dependency of a magnitude of dynamic strain D33 exhibited by a piezoelectric actuator in accordance with an example 4.

Table 5, FIG. 4, and Table 7 present the temperature characteristic of a magnitude of dynamic strain D33 measured with the driving frequency for the actuator, which is fabricated in the present example, set to 0.5 Hz.

As seen from the tables and drawing, over a temperature range from −30° C. to 80° C., the minimum value of a magnitude of dynamic strain D33 is 427 pm/V and is observed when the amplitude in driving electric field strength is 1000 V/mm and the temperature is 50° C. The maximum value of the width of variation in the magnitude of dynamic strain D33 is ±7.2% and is observed when the amplitude in driving electric field strength is 1000 V/mm.

Over a temperature range from −30° C. to 160° C., the minimum value of a magnitude of dynamic strain D33 is 427 pm/V and is observed when the amplitude in driving electric field strength is 1000 V/mm and the temperature is 50° C. The maximum value of the width of variation in the magnitude of dynamic strain D33 is ±9.4% and is observed when the amplitude in driving electric field strength is 2000 V/mm.

EXAMPLE 5

In the present example, a piezoelectric ceramic (grain-oriented piezoelectric ceramic) having a composition that specifies addition of 0.0005 mol of manganese (Mn) to the composition expressed as $\{Li_{0.065}(K_{0.435}a_{0.55})_{0.935}\}\{Nb_{0.83}Ta_{0.09}Sb_{0.08}\}O_3$ and prepared in the example 3 was produced, and used to fabricate a piezoelectric actuator.

To begin with, a sodium carbonate ($Na_2CO_3$) powder, a potassium carbonate ($K_2CO_3$) powder, a lithium carbonate ($Li_2CO_3$) powder, a diniobium pentaoxide ($Nb_2O_5$) powder, a ditantalum pentaoxide ($Ta_2O_5$) powder, a diantimony pentaoxide ($Sb_2O_5$) powder, and a manganese dioxide ($MnO_2$) powder that have a purity of 99.99% or more were weighed in units of g/m² according to a composition specifying subtraction of 0.05 mol of sodium niobate ($NaNbO_3$) from the composition which specifies summation of 1 mol of $\{Li_{0.07}(K_{0.43}Na_{0.57})_{0.93}\}\{Nb_{0.83}Ta_{0.09}Sb_{0.08}\}O_3$ and 0.0005 mol of Mn. Using an organic solvent as a medium, the powders were wet-blended in a zirconium (Zr) bowl for twenty hours. Thereafter, the mixture was calcinated at 750° C. for five hours. Using an organic solvent as a medium, the mixture was wet-pulverized in the Zr bowl for twenty hours. This resulted in a calcinated powder whose mean grain diameter was approximately 0.5 μm.

The subsequent procedure was the same as the one for the example 1 except that the burning temperature for the degreased plate-like compact was set to 1105° C. Thus, a grain-oriented ceramic having the composition that specifies the summation of 1 mol of $\{Li_{0.065}(K_{0.435}a_{0.55})_{0.935}\}\{Nb_{0.83}Ta_{0.09}Sb_{0.08}\}O_3$ and 0.0005 mol of Mn was produced.

The produced grain-oriented ceramic was evaluated relative to the density of a sintered compact, an average orientation degree, and piezoelectric properties under the same conditions as those for the example 1. Moreover, a laminated actuator including forty sheets of piezoelectric ceramic was fabricated according to the same procedure as that for the example 1, and the temperature characteristic of a magnitude of dynamic strain D33 was evaluated.

The grain-oriented ceramic produced in the present example was so highly densified that the bulk density thereof was 4.71 g/cm³. Moreover, the pseudo-cubic {100} planes of grains were oriented in parallel with the tape surface, and the average orientation degree of the pseudo-cubic {100} planes calculated according to the Lotgering's method reached 89.6%. Furthermore, the results of evaluation of the piezoelectric properties observed at room temperature (25° C.) were such that the resonant frequency Fr was 368 kHz, the Young's modulus $Y_{11}^E$ was 98.7 GPa, the piezoelectric strain constant $d_{31}$ was 99.1 pm/V, the electromechanical coupling coefficient kp was 52.0%, the mechanical quality factor Qm was 20.3, the dielectric constant $\in_{33}{}^t/\in_0$ was 1159, and the dielectric loss tanδ was 2.7%. Consequently, the addition of Mn has proved advantageous in increasing the mechanical quality factor Qm and decreasing the dielectric loss tanδ.

Moreover, the first crystal phase transition temperature (Curie temperature) obtained based on the temperature characteristic of the dielectric constant was 263° C., and the second crystal phase transition temperature was −15° C. Table 1 lists these results.

Figure 5:
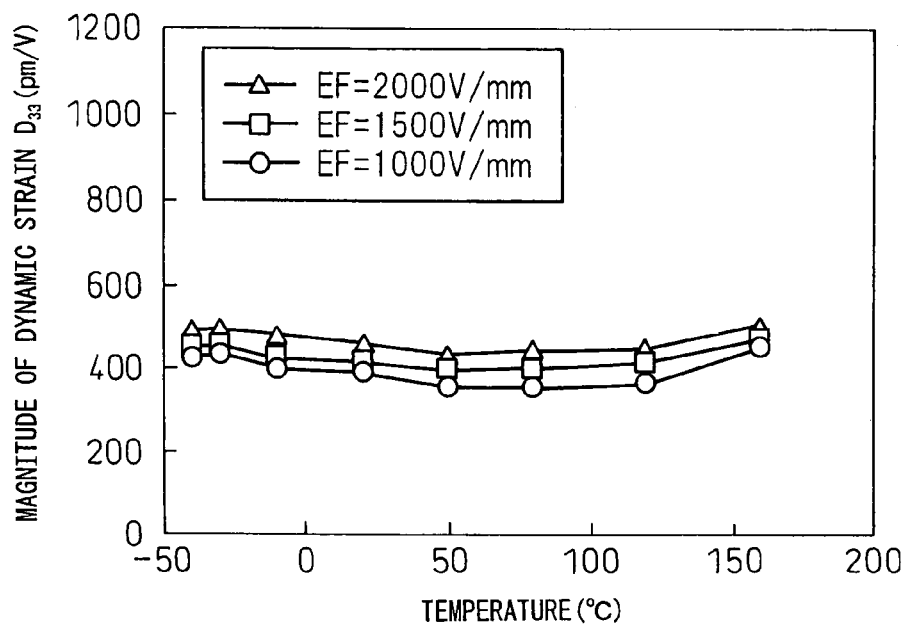
FIG. 5 is a graph showing the temperature dependency of a magnitude of dynamic strain D33 exhibited by a piezoelectric actuator in accordance with an example 5.

Table 6, FIG. 5, and Table 7 present the temperature characteristic of a magnitude of dynamic strain D33 measured with the driving frequency for the actuator, which is fabricated in the present example, set to 0.5 Hz.

As seen from the tables and drawing, over a temperature range from −30° C. to 80° C., the minimum value of a magnitude of dynamic strain D33 is 355 pm/V and is observed when the amplitude in driving electric field strength is 1000 V/mm and the temperature is 50° C. or 80° C. The maximum value of the width of variation in the magnitude of dynamic strain D33 is ±10.4% and is observed when the amplitude in driving electric field strength is 1000 V/mm.

Over a temperature range from −30° C. to 160° C., the minimum value of a magnitude of dynamic strain D33 is 355 pm/V and is observed when the amplitude in driving electric field strength is 1000 V/mm and the temperature is 50° C. or 80° C. The maximum value of the width of variation in the magnitude of dynamic strain D33 is ±11.8% and is observed when the amplitude in driving electric field strength is 1000 V/mm.

As examples to be compared with the examples 1 to 5 respectively, veneers made of a lead zirconium titanate (PZT) ceramic that was a typical piezoelectric ceramic were produced, and evaluated in the same manner as the examples 1 to 5 were (comparative examples 1 to 5).

COMPARATIVE EXAMPLE 1

The comparative example 1 is an example of a laminated actuator that is suitable for automotive fuel injection valves and that employs a lead zirconium titanate (PZT) material of the tetragonal system whose nature is intermediate between those of soft and hard systems (semi-hard). Herein, the soft system refers to materials whose mechanical quality factors Qm are equal to or smaller than 100, while the hard system refers to materials whose mechanical quality factors Qm are equal to or larger than 1000.

A lead oxide (PbO) powder, a zirconium dioxide (ZrO$_2$) powder, a titanium dioxide (TiO$_2$) powder, a strontium carbonate (SrCO$_3$) powder, a yttrium oxide (Y$_2$O$_3$) powder, a diniobium pentaoxide (Nb$_2$O$_5$) powder, and a dimanganese trioxide (Mn$_2$O$_3$) powder were weighed in the unit of g/m$^2$ according to a composition of (Pb$_{0.92}$Sr$_{0.09}$){(Zr$_{0.543}$Ti$_{0.457}$)$_{0.985}$(Y$_{0.5}$Nb$_{0.5}$)$_{0.004}$}O$_3$. Water was used as a medium to wet-blend the powders in a zirconium (Zr) bowl. Thereafter, the mixture was calcinated at 790° C. for seven hours. Furthermore, an organic solvent was used as a medium to wet-pulverize the mixture in the Zr bowl. This resulted in a slurry of a calcinated powder whose mean grain diameter was approximately 0.7 μm.

After a binder (polyvinyl butyral) and a plasticizer (dibutyl phthalate) were added to the slurry, the slurry was blended in the Zr bowl for twenty hours.

Thereafter, tape molding equipment was used to mold the blended slurry into a tape having a thickness of approximately 100 μm. Furthermore, the tape was folded or thermally crimped in order to produce a plate-like compact of 1.2 mm thick. The plate-like compact was degreased in air. The degreased plate-like compact was placed on a magnesium oxide (MgO) plate in an alumina sagger, and sintered in air at 1170° C. for two hours.

The subsequent procedure was identical to the one for the example 1 except that a silver (Ag) paste was used as an electrode material to perform burning.

The bulk density of the piezoelectric ceramic of the present comparative example was 7.60 g/cm$^3$. Moreover, the results of evaluation of the piezoelectric properties observed at room temperature (25° C.) were such that the resonant frequency Fr was 255 kHz, the Young's modulus $Y_{11}^E$ was 76.5 GPa, the piezoelectric strain constant d$_{31}$ was 158.0 pm/V, the electromechanical coupling coefficient kp was 60.2%, the mechanical quality factor Qm was 540, the dielectric constant $\epsilon_{33}^t/\epsilon_0$ was 1701, and the dielectric loss tanδ was 0.2%. Table 1 lists these results.

COMPARATIVE EXAMPLE 2

The comparative example 2 is an example of a laminated actuator that is adopted as a laminated actuator for positioning which may be employed in semiconductor manufacturing equipment in which a change in ambient temperature is small. The laminated actuator employs a piezoelectric ceramic made from a lead zirconium titanate (PZT) material belonging to the soft rhombohedral system.

For production of the piezoelectric ceramic of the present comparative example, a lead oxide (PbO) powder, a zirconium dioxide (ZrO$_2$) powder, a titanium dioxide (TiO$_2$) powder, a strontium carbonate (SrCO$_3$) powder, a yttrium oxide (Y$_2$O$_3$) powder, and a diniobium pentaoxide (Nb$_2$O$_5$) powder were weighed in the unit of g/m$^2$ according to a composition (Pb$_{0.895}$Sr$_{0.115}$){(Zr$_{0.57}$Ti$_{0.43}$)$_{0.978}$(Y$_{0.5}$Nb$_{0.5}$)$_{0.01}$Mn$_{0.012}$}O$_3$. Water was used as a medium to wet-blend the powders in a zirconium (Zr) bowl for twenty hours. Thereafter, the mixture was calcinated at 875° C. for five hours. Furthermore, water was used as a medium to wet-pulverize the mixture in the Zr bowl.

A binder (polyvinyl alcohol) was added to the slurry so that the binder will occupy 1 weight percent of the slurry or calcinated powder. Thereafter, the resultant slurry was dried using a spray drier and thus granulated.

Thereafter, dies were used to perform dry press molding. This resulted in a compact having a diameter of 15 mm and a thickness of 2 mm. Thereafter, the disk-like compact was degreased in air. Furthermore, after the degreased plate-like compact was molded according to the cold isostatic press (CIP) method under a pressure of 200 MPa, it is placed on a magnesium oxide (MgO) plate in an alumina sagger, and sintered in air at 1260° C. for two hours.

The subsequent procedure was the same as the one for the comparative example 1.

The bulk density of the piezoelectric ceramic of the present comparative example was 7.45 g/cm$^3$. Moreover, the results of evaluation of the piezoelectric properties observed at room temperature (25° C.) were such that the resonant frequency Fr was 229 kHz, the Young's modulus $Y_{11}^E$ was 60.2 GPa, the piezoelectric strain constant d$_{31}$ was 212.7 pm/V, the electromechanical coupling coefficient kp was 67.3%, the mechanical quality factor Qm was 47.5, the dielectric constant $\epsilon_{33}^t/\epsilon_0$ was 1943, and the dielectric loss tanδ was 2.1%. Table 1 lists these results.

COMPARATIVE EXAMPLE 3

The comparative example 3 is an example of a laminated actuator that is suitable for automotive knock sensors and that employs a piezoelectric ceramic made from a lead zirconium titanate (PZT) material belonging to the soft tetragonal system.

For production of the piezoelectric ceramic employed in the present comparative example, a lead oxide (PbO) powder, a zirconium dioxide (ZrO$_2$) powder, a titanium dioxide (TiO$_2$) powder, a strontium titanate (SrTiO$_3$) powder, and a diantimony trioxide (Sb$_2$O$_3$) powder were weighed in the unit of g/m$^2$ according to a composition (Pb$_{0.95}$Sr$_{0.05}$){(Zr$_{0.53}$Ti$_{0.47}$)$_{0.978}$Sb$_{0.022}$}O$_3$. Water was used as a medium to wet-blend the powders in a zirconium (Zr) bowl for twenty hours. Thereafter, the mixture was calcinated at 825° C. for five hours. Furthermore, water was used as a medium to wet-pulverize the mixture in the Zr bowl.

The subsequent procedure was identical to that for the comparative example 2 except that the sintering temperature was set to 1230° C.

The bulk density of the piezoelectric ceramic of the present comparative example was 7.60 g/cm$^3$. The results of evaluation of the piezoelectric properties observed at room temperature (25° C.) were such that the resonant frequency Fr was 238 kHz, the Young's modulus $Y_{11}^E$ was 66.5 GPa, the piezoelectric strain constant d$_{31}$ was 203.4 pm/V, the electromechanical coupling coefficient kp was 62.0%, the mechanical quality factor Qm was 55.8, the dielectric constant $\epsilon_{33}^t/\epsilon_0$ was 2308, and the dielectric loss tanδ was 1.4%. Table 1 lists these results.

COMPARATIVE EXAMPLE 4

The comparative example 4 is an example of a laminated actuator that is suitable for high-power ultrasonic motors and that employs a piezoelectric ceramic made from a lead zirconium titanate (PZT) material belonging to the semi-hard tetragonal system.

For production of the piezoelectric ceramic employed in the present comparative example, a lead oxide (PbO) powder, a zirconium dioxide (ZrO$_2$) powder, a titanium dioxide (TiO$_2$) powder, a strontium carbonate (SrCO$_3$) powder, a diantimony trioxide (Sb$_2$O$_3$) powder, and a manganese carbonate (MnCO$_3$) powder were weighed in the unit of g/m$^2$ according to a composition (Pb$_{0.965}$Sr$_{0.05}$){(Zr$_{0.5}$ $Ti_{0.5})_{0.96}Sb_{0.03}Mn_{0.01}\}O_3$. Water was used as a medium to wet-blend the powders in a zirconium (Zr) bowl. Thereafter, the mixture was calcinated at 875° C. for five hours. Furthermore, water was used as a medium to wet-pulverize the mixture in the Zr bowl.

The subsequent procedure was the same as the one for the comparative example 2 except that the sintering temperature was set to 1230° C.

The bulk density of the piezoelectric ceramic of the present comparative example was 7.76 g/cm³. The results of evaluation of the piezoelectric properties observed at room temperature (25° C.) were such that the resonant frequency Fr was 267 kHz, the Young's modulus $Y_{11}^E$ was 85.7 GPa, the piezoelectric strain constant $d_{31}$ was 136.9 pm/V, the electromechanical coupling coefficient kp was 57.9%, the mechanical quality factor Qm was 850, the dielectric constant $\epsilon_{33}^t/\epsilon_0$ was 1545, and the dielectric loss tanδ was 0.2%. Table 1 lists these results.

COMPARATIVE EXAMPLE 5

The comparative example 5 is a laminated actuator that is suitable for high-sensitivity angular velocity sensors and that employs a piezoelectric ceramic made from a lead zirconium titanate (PZT) material belonging to the hard tetragonal system.

For production of the piezoelectric ceramic employed in the present comparative example, a lead oxide (PbO) powder, a zirconium dioxide ($ZrO_2$) powder, a titanium dioxide ($TiO_2$) powder, a zinc oxide (ZnO) powder, a manganese carbonate ($MnCO_3$) powder, and a diniobium pentaoxide ($Nb_2O_5$) powder were weighed in the unit of g/m² according to a composition $Pb\{(Zr_{0.5}Ti_{0.5})_{0.98}(Zn_{0.33}Nb_{0.67})_{0.01}Mn_{0.01}\}O_3$. Water was used as a medium to wet-blend the powders in a zirconium (Zr) bowl. Thereafter, the mixture was calcinated at 800° C. for five hours. Furthermore, water was used as a medium to wet-pulverize the mixture in the Zr bowl.

The subsequent procedure was the same as the one for the comparative example 2 except that the sintering temperature was set to 1200° C.

The bulk density of the piezoelectric ceramic of the present comparative example was 7.84 g/cm³. The results of evaluation of the piezoelectric properties observed at room temperature (25° C.) were such that the resonant frequency Fr was 272 kHz, the Young's modulus $Y_{11}^E$ was 89.8 GPa, the piezoelectric strain constant $d_{31}$ was 103.6 pm/V, the electromechanical coupling coefficient kp was 54.1%, the mechanical quality factor Qm was 1230, the dielectric constant $\epsilon_{33}^t/\epsilon_0$ was 1061, and the dielectric loss tanδ was 0.2%. Table 1 lists these results.

EXAMPLE 6

Restricting the Lower Limit of a Magnitude of Dynamic Strain

When driving electric field strength is smaller than 1000 V/mm, a magnitude of dynamic strain gets smaller.

In the example, a magnitude of dynamic strain to be attained with the driving electric field strength for the piezoelectric actuator decreased is obtained.

Figure 6:
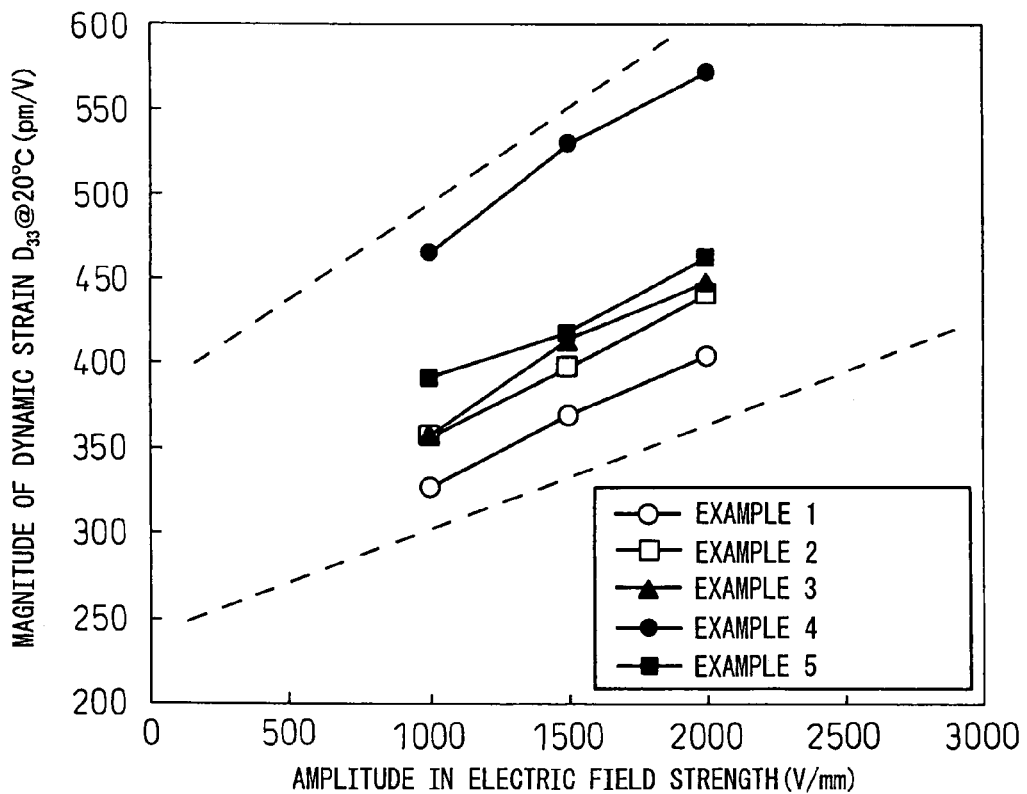
FIG. 6 is a graph showing the relationships between driving electric field strength and a magnitude D33 of dynamic strain which are established in the respective piezoelectric actuators of the examples 1 to 5 according to an example 6.

FIG. 6 presents the relationships between the driving electric field strength and the magnitude of dynamic strain observed at 20° C. which are established in the piezoelectric actuators fabricated in the examples 1 to 5 respectively.

FIG. 6 demonstrates that when driving electric field strength is set to 100 V/mm that is the lower limit required for the actuator, the magnitude of dynamic strain is 250 pm/V or more.

EXAMPLE 7

Restricting the Temperature Characteristic of a Magnitude of Dynamic Strain Under Small Electric Field Strength In the present example, the width of variation in a displacement to be attained when a magnitude of dynamic strain is small and driving electric field strength is smaller than 1000 V/mm is obtained.

For this purpose, a voltage to be applied to a piezoelectric actuator should be lowered in order to perform measurement. When electric field strength falls below 500 V/mm, a piezoelectric actuator fabricated in the present example makes a small displacement. This brings about a possibility that the precision in measurement may be degraded. In addition, it is hard to evaluate the temperature characteristic.

When the piezoelectric lateral strain constant $d_{31}$ of a veneer is measured, although the absolute value of a displacement is hard to estimate, the temperature characteristic of the displacement can be estimated. Therefore, in the present example, the piezoelectric lateral strain constant $d_{31}$ of a veneer was measured according to a resonance-antiresonance method.

Figure 7:
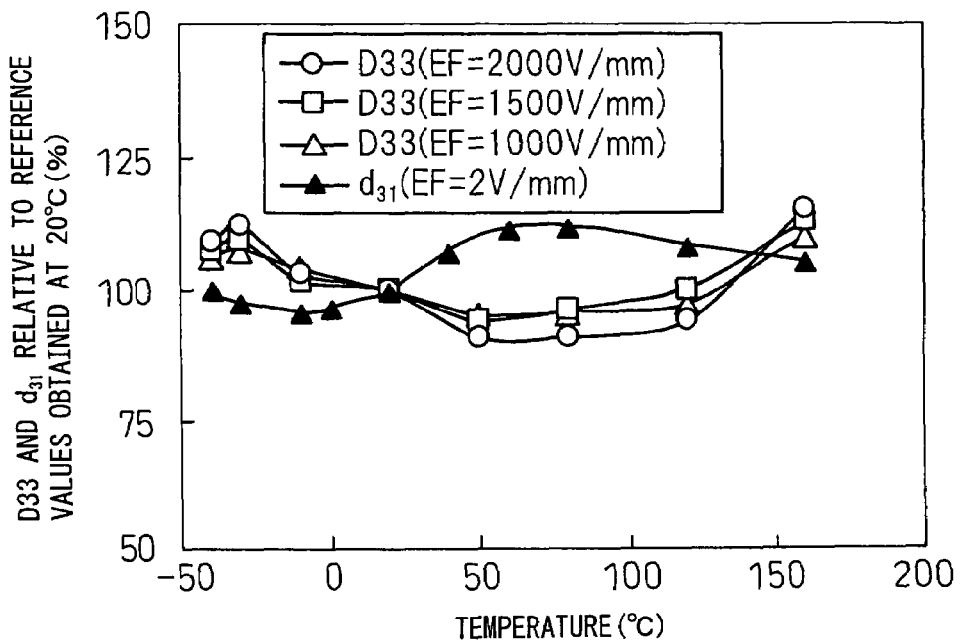
FIG. 7 is a graph showing a measured value representing a temperature characteristic of a piezoelectric strain constant $d_{31}$ exhibited by a veneer produced in the example 5, and the magnitudes of dynamic strains observed in the example 5 under driving electric field strengths ranging from 1000 V/mm to 2000 V/mm, wherein the measured value and the magnitudes of dynamic strains are standardized relative to values obtained at 20° C.

FIG. 7 shows for comparison the measured value of the temperature characteristic of the piezoelectric strain constant $d_{31}$ of the veneer produced in the example 5, and the magnitudes of dynamic strains obtained in the example 5 under the driving electric field strengths ranging from 1000 V/mm to 2000 V/mm. Herein, the piezoelectric strain constant and the magnitudes of dynamic strains are standardized using the values obtained at 20° C.

As seen from FIG. 7, the width of variation in the piezoelectric strain constant $d_{31}$ of the veneer over a temperature range from –30° C. to 80° C. is ±7.8%. The width of variation in the piezoelectric strain constant $d_{31}$ of the veneer over a temperature range from –30° C. to 160° C. is ±9.2%. The values are almost the same as the widths of variations in the magnitudes of dynamic strains obtained under the driving electric field strengths ranging from 1000 V/mm to 2000 V/mm.

Consequently, as far as the actuator in accordance with the present invention is concerned, even when the driving electric field strength is decreased to be smaller than 1000 V/mm, the width of variation in a displacement can be decreased over a wide temperature range from –30° C. to 160° C.

EXAMPLE 8

Restricting a Coefficient of Thermal Conductivity

Table 8 lists the results of measurement performed on the sintered compacts produced in the example 2 and comparative example 1 with respect to a coefficient of thermal diffusivity, a specific heat, and a coefficient of thermal conductivity.

For measurement of the coefficient of thermal diffusivity, the sintered compacts were ground or machined to have a disk-like shape of 0.75 mm thick and 10 mm in diameter. Carbon was sprayed to the surfaces of each of the disks by a thickness of about 1 μm, whereby the surfaces were blackened. The resultant disks were used as specimens for measurement of the coefficient of thermal diffusivity.

A laser pulse heating method was adopted as a method for measuring the coefficient of thermal diffusivity. Equipment employed was model TC-7000 manufactured by ULVAC-RIKO Inc., and the measurement temperature was 25° C., 120° C., or 160° C. Irradiated light was ruby laser light (an excitation voltage was 2.5 kV, and one homogenization filter and one neutral density filter were employed). Moreover, the precision in measurement of the coefficient of thermal diffusivity was about ±5%.

For measurement of a specific heat, test pieces whose weights ranged from 70 mg to 90 mg were acquired from the sintered compacts and used as specimens for measurement.

Differential scanning calorimetry (DSC) was adopted as a method of measuring a specific heat. An apparatus employed was a differential scanning calorimeter model Perkin-Elmer DSC-7, and the measurement temperature was 25° C., 120° C., or 160° C. The temperature raising rate was 10° C./min$^{-1}$. The precision in measurement of a coefficient of thermal diffusivity was on the order of ±1%.

A coefficient of thermal conductivity was calculated as the product of a coefficient of thermal diffusivity by a heat capacity (a density by a specific heat) according to the following equation A3:

$$\lambda = \alpha \rho Cp \quad (A3)$$

where $\lambda$ denotes a coefficient of thermal conductivity [Wm$^{-1}$K$^{-1}$], $\alpha$ denotes a coefficient of thermal diffusivity [m$^2$s$^{-1}$], $\rho$ denotes a bulk density of a sintered compact [kgm$^{-3}$], and Cp denotes a specific heat [Jkg$^{-1}$K$^{-1}$].

As listed in Table 8, the coefficient of thermal conductivity of the example 2 exceeds 2 Wm$^{-1}$K$^{-1}$ at any of the temperatures 25° C., 120° C., and 160° C., and is a large value that is nearly twice as large as that of the comparative example 1. This demonstrates that the employment of the grain-oriented piezoelectric ceramic of the present invention permits realization of an actuator exhibiting excellent heat radiation performance.

EXAMPLE 9

Restricting a Coefficient of Thermal Expansion

Figure 8:
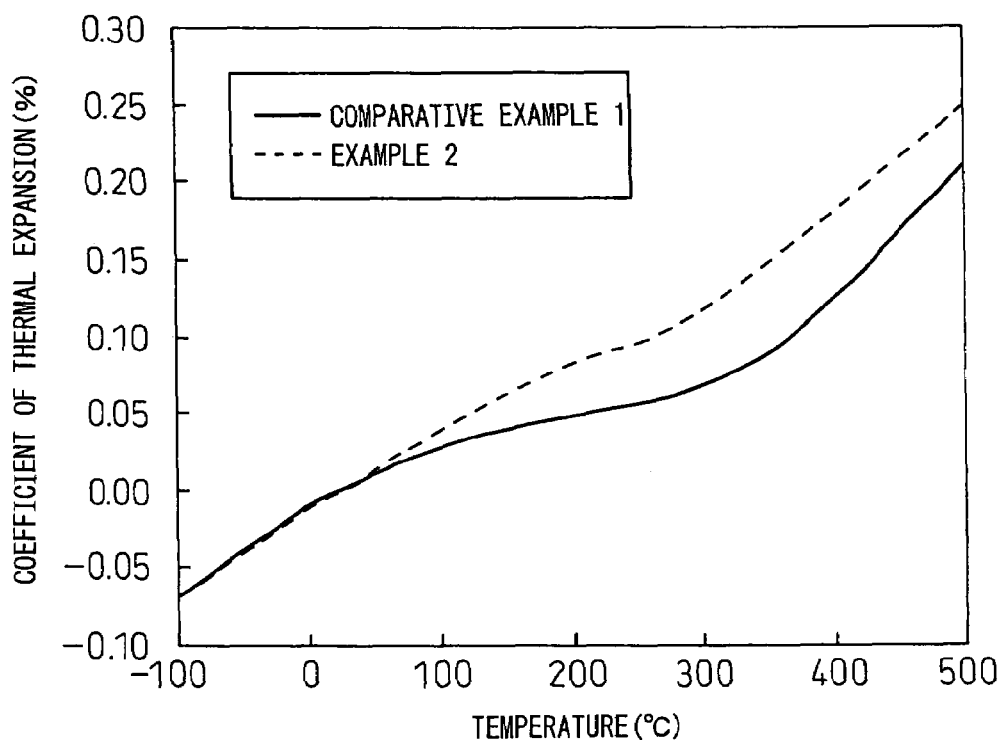
FIG. 8 is a graph showing the temperature dependencies of coefficients of linear thermal expansion exhibited by the piezoelectric ceramics produced in the example 2 and a comparative example 1, wherein the temperature dependencies are observed according to an example 9.

Table 9 lists the results of measurement performed on the sintered compacts (piezoelectric ceramics) produced in the example 2 and comparative example 1 with respect to a coefficient of linear thermal expansion and a coefficient of thermal expansion. FIG. 8 shows the temperature characteristic of the coefficient of thermal expansion observed with 25° C. regarded as the reference temperature.

For measurement of a coefficient of linear thermal expansion, the sintered compacts were ground or machined to have a width of 5 mm, a thickness of 1.5 mm, and a length of 10 mm, and adopted as specimens for measurement of the coefficient of linear thermal expansion.

Thermo-mechanical analysis (TMA) was adopted as a method for measuring a coefficient of linear thermal expansion. An apparatus employed was a thermo-mechanical analyzer model TMA-50 manufactured by Shimadzu Corp. A measurement temperature range was from –100° C. to 500° C. A temperature raising rate was 2° C./min. The measurement atmosphere was the atmospheric air.

A coefficient of linear thermal expansion was defined as a rate of change, $\Delta L/L_0$, in the length of a specimen where $\Delta L$ denotes a change in temperature and $L_0$ denotes the length of a specimen at the reference temperature (25° C.). A coefficient of linear thermal expansion ($\Delta L/L_0$)-versus-temperature curve was used to obtain a coefficient of linear thermal expansion $\beta$ according to the equation A4 below. Herein, the $\beta$ value was calculated according to a central difference method with a difference in temperature dT set to 20° C.

Incidentally, the $\beta$ value is equivalent to a derivative of a temperature acquired from the $\Delta L/L_0$-versus-temperature curve.

$$\beta = (1/L_0) \times (dL/dT) \quad (A4)$$

In the above equation, $L_0$ denotes the length of a specimen at the reference temperature (25° C.), dT denotes a difference in temperature (20° C.), and dL denotes a length of expansion associated with the difference in temperature dT.

As seen from Table 9 and FIG. 8, the coefficient of thermal expansion of the example 2 exceeds 4 ppm/° C. over a temperature range from –30° C. to 160° C. On the other hand, the coefficient of thermal expansion of the comparative example 1 falls below 3 ppm/° C. over a temperature range from 100° C. to 160° C. This demonstrates that the employment of a grain-oriented piezoelectric ceramic in accordance with the present invention permits realization of an actuator in which a thermal stress occurring between the piezoelectric ceramic and a metal or resin whose coefficient of thermal expansion is larger is limited.

EXAMPLE 10

Restricting a Pyroelectric Coefficient

Figure 9:
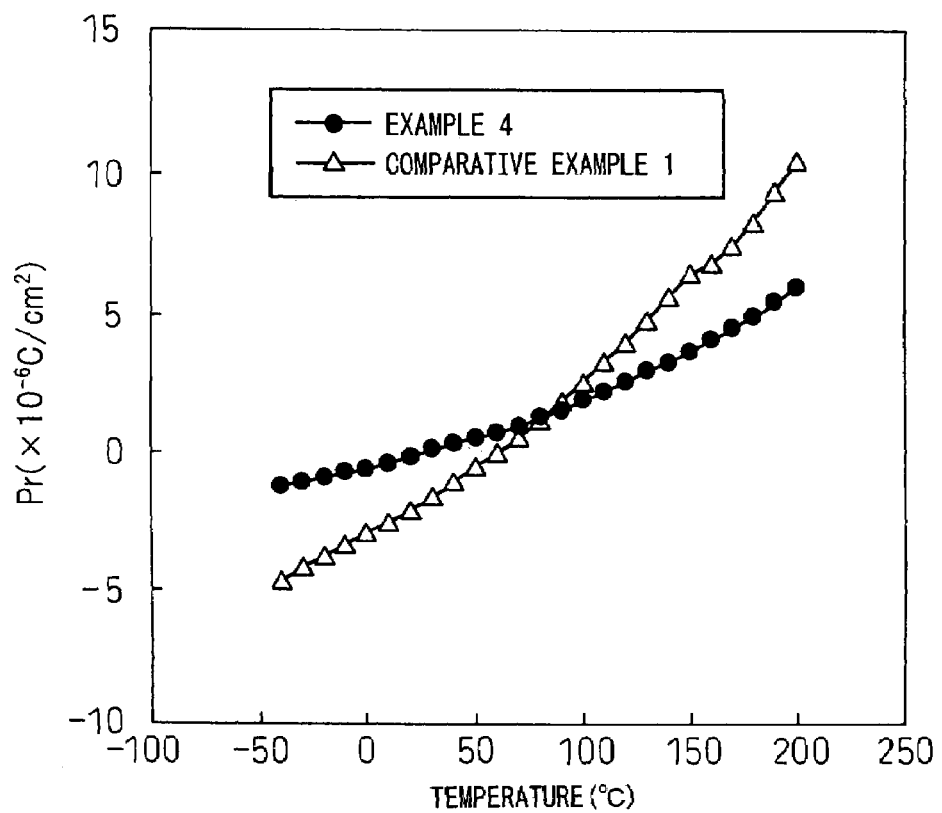
FIG. 9 is a graph showing the temperature dependencies of changes in magnitudes of polarization occurring in the piezoelectric ceramics produced in the example 4 and the comparative example 1, wherein the temperature dependencies are observed according to an example 10.

FIG. 9 shows the results of measurement performed on the veneers produced in the example 4 and comparative example 1 with respect to the temperature characteristic of a change in a magnitude of polarization Pr.

For measurement of the temperature characteristic of a magnitude of polarization Pr, the piezoelectric elements produced in the example 4 and comparative example 1 were adopted as specimens for measurement. A pyroelectric current method was adopted to perform measurement over a measurement temperature range from –40° C. to 200° C.

The piezoelectric elements were put in a thermostat, and the temperature thereof was lowered from 25° C. to –40° C. at a rate of 2° C./min. Thereafter, the temperature of the piezoelectric elements was raised from –40° C. to 200° C. at the rate of 2° C./min. A current flowing out of the upper and lower electrode surfaces of each of the piezoelectric elements was measured at intervals of approximately 30 sec using a microammeter. At the same time, the temperatures and accurate time instants at which the current was measured were also recorded. A change in a magnitude of polarization, $\Delta P$ [C/cm$^2$], and a change in temperature occurring during an interval between adjoining measurements, $\Delta T$, were calculated according to the following equations:

$$\Delta P = \{(I_1 + I_2)/2\} \times (t_1 - t_2)/S$$

$$\Delta T = T_1 - T_2$$

where $\Delta P$ denotes a change in a magnitude of polarization [μC/cm$^2$], $(t_1 - t_2)$ denotes an interval [s] between adjoining measurements, $I_1$ denotes a current [A] detected at a time instant $t_1$, $T_1$ denotes the temperature [° C.] at the time instant $t_1$, $I_2$ denotes a current [A] detected at a time instant $t_2$, $T_2$ denotes the temperature [° C.] at the time instant $t_2$, and S denotes an area [cm²] of one of the electrodes of a piezoelectric element. A pyroelectric coefficient at the temperature provided as the quotient $(T_1+T_2)/2$ was calculated as the absolute value of the quotient $\Delta P/\Delta T$.

Thermo-mechanical analysis (TMA) was adopted as a method for measuring a coefficient of linear thermal expansion. An apparatus employed was a thermo-mechanical analyzer model TMA-50 manufactured by Shimadzu Corp. A measurement temperature range was from −100° C. to 500° C. A temperature raising rate was 2° C./min, and a measurement atmosphere was the atmospheric air.

Over a temperature range from −30° C. to 160° C., the pyroelectric coefficient of the veneer of the example 4 was 271 $\mu Cm^{-2}K^{-1}$. On the other hand, the pyroelectric coefficient of the veneer of the comparative example 1 was 581 $\mu Cm^{-2}K^{-1}$ or twice larger than that of the example 4. This demonstrates that the employment of a grain-oriented piezoelectric ceramic in accordance with the present invention permits realization of a piezoelectric actuator in which a variation of a terminal voltage derived from a change in ambient temperature is limited.

EXAMPLE 11

Difference in a Breaking Load

Figure 10:
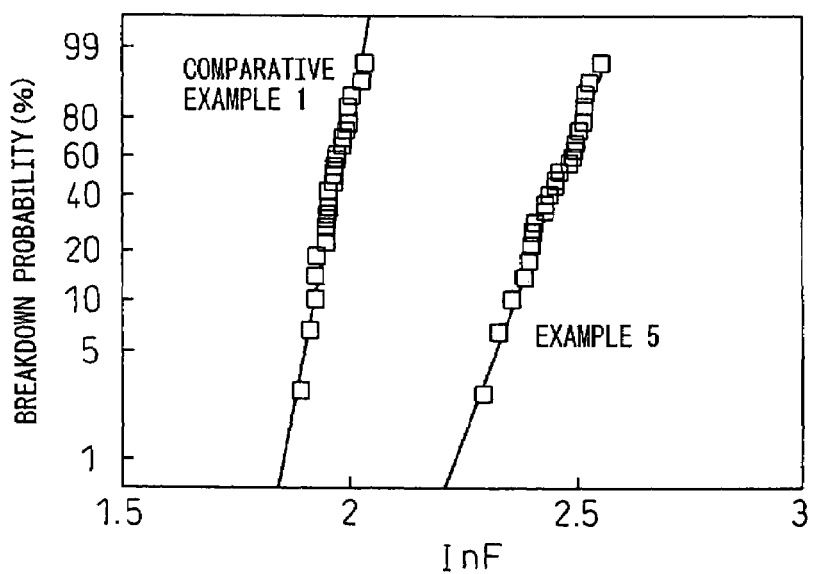
FIG. 10 is a graph showing the relationships between a breakdown probability and an Inf value which are established in the respective piezoelectric ceramics produced in the example 5 and the comparative example 1 according to an example 11.

FIG. 10 shows Weibull distributions as the results of measurement performed on the sintered compacts (piezoelectric ceramics) produced in the example 5 and comparative example 1 respectively with respect to a breaking load.

In FIG. 10, the axis of abscissas shows natural logarithms of a breaking load F [N], and the axis of ordinates shows breakdown probabilities [%].

For measurement of a breaking load, the sintered compacts were ground or machined to have a shape of 0.4 mm in thickness by 7 mm whose four corners were C-chamfered by a chamfer dimension of 1 mm. Thus, specimens for measurement were produced.

A biaxial bending test method (a ball-on-ring method) was adopted as a method for measuring a breaking load using autograph. A ring employed was model SC211 having an outer diameter of 6 mm and an inner diameter of 4 mm, and a ball employed was made of zirconium oxide (ZrO2) and had a diameter of 2 mm. Both the ring and ball were mirror-finished. Moreover, a loading speed was 0.5 mm/min. The number of specimens produced from the example 5, N, was twenty-six, and the number of specimens produced from the comparative example 1, N, was twenty-five.

A mean value of breaking loads F imposed on the example 5 was 11.7 N (the maximum value was 12.9 N, and the minimum value was 9.9 N). A Weibull coefficient, m, was 17.7. On the other hand, a mean value of breaking loads imposed on the comparative example 1 was 7.2 N (the maximum value was 7.6 N and the minimum value was 6.7 N). The Weibull coefficient, m, was 34.8. The breaking loads imposed on the example were twice larger than those imposed on the comparative example.

Consequently, the employment of a grain-oriented piezoelectric ceramic in accordance with the present invention permits realization of an actuator that is hardly broken despite a stress occurring during assembling or driving.

EXAMPLE 12

Temperature Characteristic of Mechanical Quality Factor Qm

Figure 11:
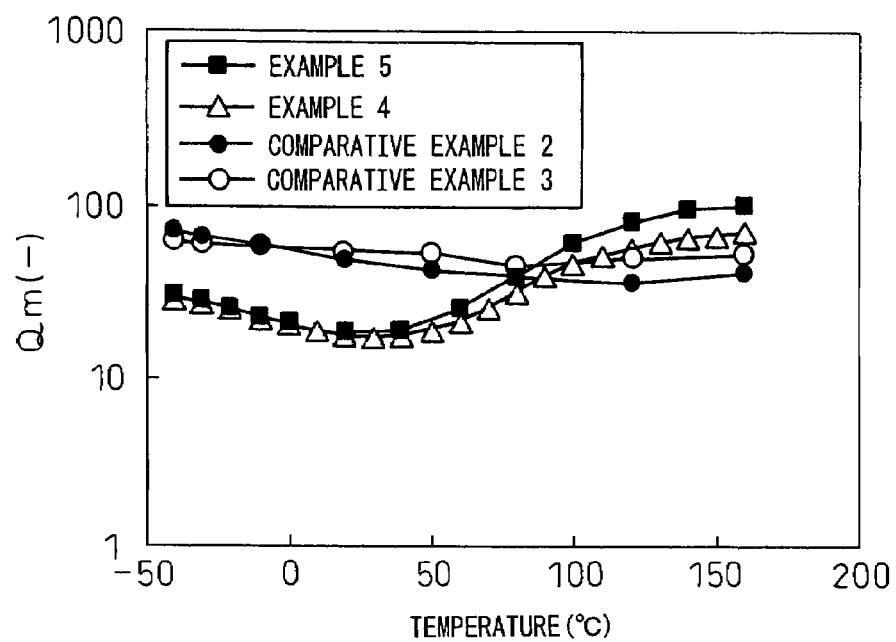
FIG. 11 is a graph showing the temperature dependencies of the mechanical quality factors exhibited by piezoelectric elements produced in the example 4, example 5, comparative example 2, and comparative example 3, wherein the temperature dependencies are observed according to an example 12.

FIG. 11 shows the results of measurement performed on the piezoelectric elements produced in the example 4, example 5, comparative example 2, and comparative example 3 with respect to the temperature characteristic of a mechanical quality factor (Qm).

The example 4 and example 5 exhibit small values near the temperature 25° C. (room temperature). At temperatures higher than 25° C. and lower than that, the mechanical quality factors thereof are larger.

The maximum value exhibited by the example 4 at the temperatures ranging from −30° C. to 80° C. is 32.6 observed at 80° C. Moreover, the mechanical quality factor gets larger over a temperature range higher than 80° C., that is, the mechanical quality factor is 48.4 at 100° C., and 73.4 at 160° C.

The maximum value exhibited by the example 5 at the temperatures ranging from −30° C. to 80° C. is 41.2 observed at 80° C. Moreover, the mechanical quality factor gets larger over a temperature range higher than 80° C., that is, the mechanical quality factor is 81.6 at 100° C., and 103.1 at 160° C.

On the other hand, the maximum value exhibited by the comparative example 2 at the temperatures ranging from −30° C. to 80° C. is 66.2 at −30° C. Moreover, the comparative example 3 exhibits 61.1 at −30° C.

Consequently, the employment of a grain-oriented piezoelectric ceramic in accordance with the present invention makes it possible to decrease the mechanical quality factor Qm of an entire oscillatory system included in an actuator over the temperature range from −30° C. to 80° C., and therefore permits realization of a piezoelectric acoustic part in which a difference in a sound pressure between a resonating point and any other point is limited.

EXAMPLE 13

Temperature Characteristic of a Dielectric Loss Tanδ

Figure 12:
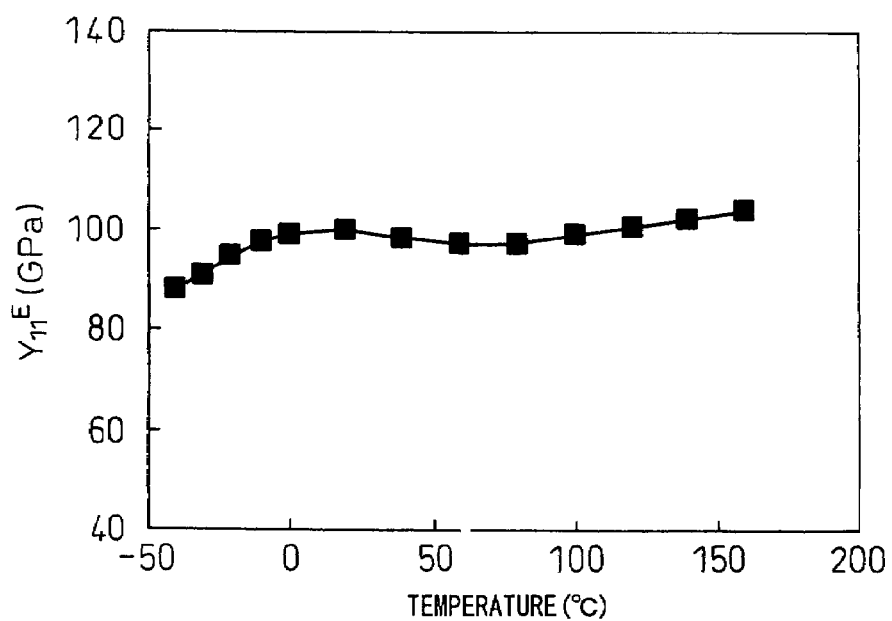
FIG. 12 is a graph showing the temperature dependency of a Young's modulus ($Y_{11}^E$) exhibited by the piezoelectric element produced in the example 5, wherein the temperature dependency is observed according to an example 13.
Figure 13:
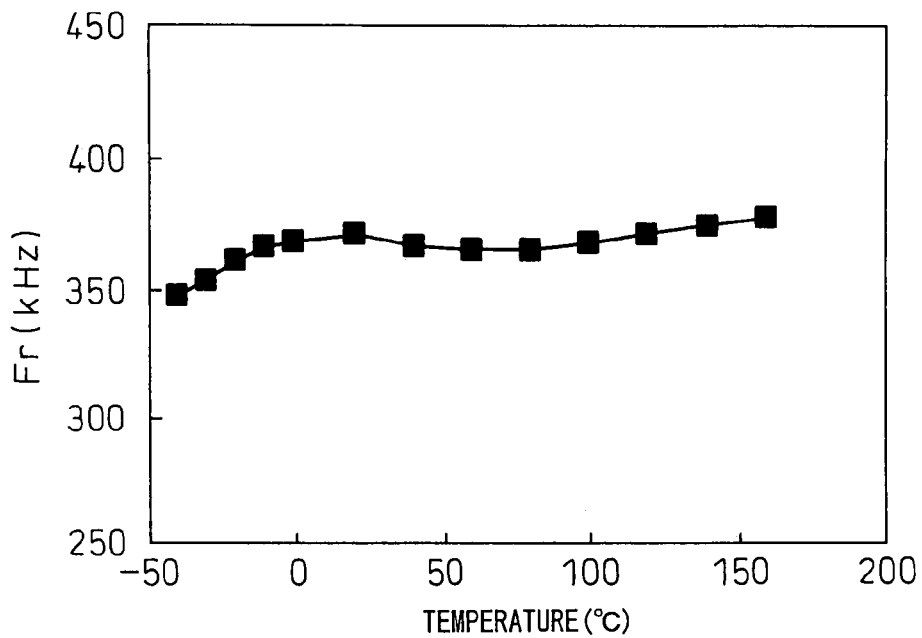
FIG. 13 is a graph showing the temperature dependency of a resonant frequency (Fr) exhibited by the piezoelectric element produced in the example 5, wherein the temperature dependency is observed according to the example 13.
Figure 14:
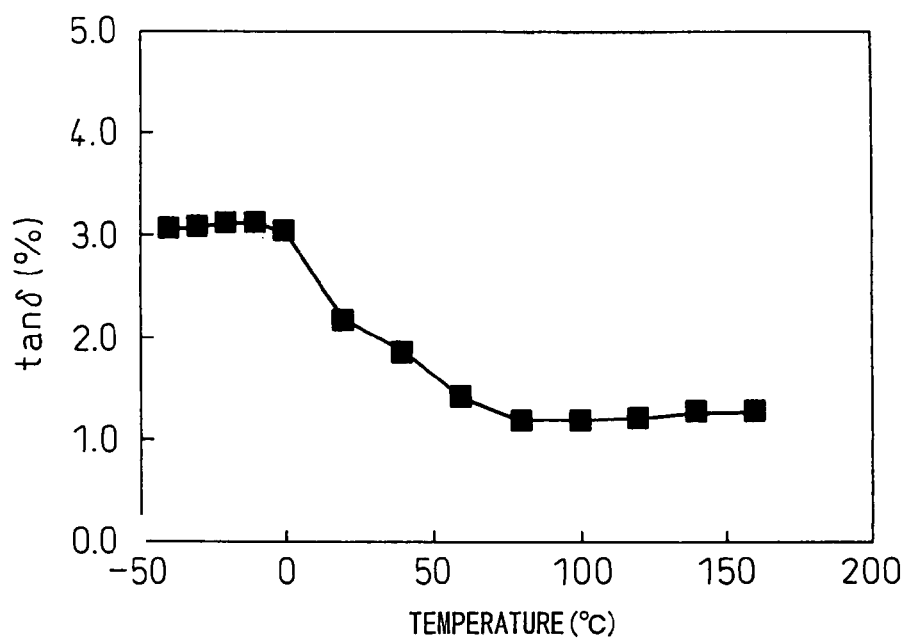
FIG. 14 is a graph showing the temperature dependency of a dielectric loss ($\tan\delta$) occurring in the piezoelectric element produced in the example 5, wherein the temperature dependency is observed according to the example 13.

FIG. 12, FIG. 13, and FIG. 14 show the results of measurements performed on the piezoelectric element produced in the example 5 with respect to the temperature dependencies of a Young's modulus $(Y_{11}^E)$, a resonant frequency (Fr), and a dielectric loss (tanδ) respectively.

Over a temperature range from −30° C. to 80° C., the Young's modulus $(Y_{11}^E)$ decreases at the temperature of −10° C. or less. The minimum value of the Young's modulus is 91 GPa observed at −30° C. The resonant frequency (Fr) also decreases at the temperature of −10° C. or less. The minimum value of the resonant frequency is 353 kHz observed at −30° C. or larger than 81 kHz exhibited by the comparative example 5 at room temperature (25° C.).

Consequently, the employment of a grain-oriented piezoelectric ceramic in accordance with the present invention permits realization of an actuator that exhibits a high resonant frequency over a temperature range from −30° C. to 160° C.

Moreover, the dielectric loss (tanδ) is high over a temperature range from 0° C. to −30° C., and remains nearly constant at approximately 3%. Over a temperature range from 80° C. to 160° C., the dielectric loss (tanδ) is as low as approximately 1.2%. The employment of a grain-oriented piezoelectric ceramic in accordance with the present invention makes it possible to keep the dielectric loss (tanδ) low at high temperatures at which heat dissipation from an actuator being driven poses a problem. Therefore, the heat dissipation from the actuator will presumably be limited.

TABLE 1

| Example No. | Bulk density [g/cm³] | Average orientation degree [%] | tanδ [%] | $\epsilon_{33}{}^T/\epsilon_0$ [-] | Fr [kHz] | $Y_{11}{}^E$ [GPa] | Qm [-] | kp [%] | $d_{31}$ [pm/V] | First crystal phase transition temperature [° C.] | Second crystal phase transition temperature [° C.] |
|---|---|---|---|---|---|---|---|---|---|---|---|
| Example 1 | 4.72 | 88.5 | 6.4 | 1042 | 376 | 103.0 | 18.2 | 48.8 | 86.5 | 282 | −30 |
| Example 2 | 4.72 | 94.6 | 4.7 | 1071 | 374 | 102.5 | 16.6 | 48.9 | 88.1 | 256 | −35 |
| Example 3 | 4.71 | 93.9 | 5.2 | 1155 | 371 | 100.2 | 15.9 | 50.4 | 95.2 | 261 | −12 |
| Example 4 | 4.78 | 96.0 | 4.7 | 1079 | 362 | 96.6 | 15.2 | 51.9 | 96.5 | 279 | −28 |
| Example 5 | 4.71 | 89.6 | 2.7 | 1169 | 368 | 98.7 | 20.3 | 52.0 | 99.1 | 263 | −15 |
| Comparative example 1 | 7.60 | — | 0.2 | 1701 | 255 | 76.5 | 540 | 60.2 | 158.0 | — | — |
| Comparative example 2 | 7.45 | — | 2.1 | 1943 | 229 | 60.2 | 47.5 | 67.3 | 212.7 | — | — |
| Comparative example 3 | 7.60 | — | 1.4 | 2308 | 238 | 66.5 | 55.8 | 62.0 | 203.4 | — | — |
| Comparative example 4 | 7.76 | — | 0.2 | 1545 | 267 | 85.7 | 850 | 57.9 | 136.9 | — | — |
| Comparative example 5 | 7.84 | — | 0.2 | 1061 | 272 | 89.8 | 1230 | 54.1 | 103.6 | — | — |

TABLE 2

(Example 1)

| Driving electric field strength: EF | Temperature [° C.] | Magnitude of dynamic strain [pm/V] |
|---|---|---|
| EF = 2000 V/mm | 160 | 443 |
| | 120 | 391 |
| | 80 | 379 |
| | 50 | 385 |
| | 20 | 404 |
| | −10 | 392 |
| | −30 | 387 |
| | −40 | 372 |
| EF = 1500 V/mm | 160 | 390 |
| | 120 | 356 |
| | 80 | 342 |
| | 50 | 350 |
| | 20 | 369 |
| | −10 | 358 |
| | −30 | 344 |
| | −40 | 323 |
| EF = 1000 V/mm | 160 | 332 |
| | 120 | 317 |
| | 80 | 312 |
| | 50 | 317 |
| | 20 | 326 |
| | −10 | 317 |
| | −30 | 303 |
| | −40 | 280 |

TABLE 3

(Example 2)

| Driving electric field strength: EF | Temperature [° C.] | Magnitude of dynamic strain [pm/V] |
|---|---|---|
| EF = 2000 V/mm | 160 | 566 |
| | 120 | 476 |
| | 80 | 448 |
| | 50 | 429 |
| | 20 | 441 |
| | −10 | 446 |
| | −30 | 462 |
| | −40 | 455 |
| EF = 1500 V/mm | 160 | 499 |
| | 120 | 433 |
| | 80 | 401 |
| | 50 | 388 |

TABLE 3-continued (Example 2)

| Driving electric field strength: EF | Temperature [° C.] | Magnitude of dynamic strain [pm/V] |
|---|---|---|
| | 20 | 398 |
| | −10 | 417 |
| | −30 | 417 |
| | −40 | 417 |
| EF = 1000 V/mm | 160 | 422 |
| | 120 | 379 |
| | 80 | 379 |
| | 50 | 365 |
| | 20 | 355 |
| | −10 | 384 |
| | −30 | 417 |
| | −40 | 412 |

TABLE 4

(Example 3)

| Driving electric field strength: EF | Temperature [° C.] | Magnitude of dynamic strain [pm/V] |
|---|---|---|
| EF = 2000 V/mm | 160 | 519 |
| | 120 | 444 |
| | 80 | 424 |
| | 50 | 425 |
| | 20 | 448 |
| | −10 | 462 |
| | −30 | 462 |
| | −40 | 450 |
| EF = 1500 V/mm | 160 | 485 |
| | 120 | 415 |
| | 80 | 384 |
| | 50 | 393 |
| | 20 | 415 |
| | −10 | 425 |
| | −30 | 430 |
| | −40 | 411 |
| EF = 1000 V/mm | 160 | 434 |
| | 120 | 375 |
| | 80 | 347 |
| | 50 | 350 |
| | 20 | 357 |
| | −10 | 380 |
| | −30 | 385 |
| | −40 | 370 |

TABLE 5

(Example 4)

| Driving electric field strength: EF | Temperature [° C.] | Magnitude of dynamic strain [pm/V] |
|---|---|---|
| EF = 2000 V/mm | 160 | 675 |
| | 120 | 600 |
| | 80 | 564 |
| | 50 | 559 |
| | 20 | 571 |
| | −10 | 588 |
| | −30 | 559 |
| | −40 | 500 |
| EF = 1500 V/mm | 160 | 572 |
| | 120 | 546 |
| | 80 | 512 |
| | 50 | 502 |
| | 20 | 531 |
| | −10 | 537 |
| | −30 | 527 |
| | −40 | 467 |
| EF = 1000 V/mm | 160 | 431 |
| | 120 | 460 |
| | 80 | 441 |
| | 50 | 427 |
| | 20 | 465 |
| | −10 | 493 |
| | −30 | 483 |
| | −40 | 436 |

TABLE 6

(Example 5)

| Driving electric field strength: EF | Temperature [° C.] | Magnitude of dynamic strain [pm/V] |
|---|---|---|
| EF = 2000 V/mm | 160 | 510 |
| | 120 | 460 |
| | 80 | 444 |
| | 50 | 438 |
| | 20 | 462 |
| | −10 | 480 |
| | −30 | 498 |
| | −40 | 492 |
| EF = 1500 V/mm | 160 | 474 |
| | 120 | 418 |
| | 80 | 403 |
| | 50 | 395 |
| | 20 | 418 |
| | −10 | 426 |
| | −30 | 458 |
| | −40 | 450 |
| EF = 1000 V/mm | 160 | 450 |
| | 120 | 367 |
| | 80 | 355 |
| | 50 | 355 |
| | 20 | 391 |
| | −10 | 403 |
| | −30 | 438 |
| | −40 | 427 |

TABLE 7

| Example No. | Driving electric field strength (V/mm) | Temperature range (° C.) | Magnitude of dynamic strain D33 Maximum value (pm/V) | Minimum value (pm/V) | Mean value (pm/V) | Width of variation (%) |
|---|---|---|---|---|---|---|
| Example 1 | 2000 | −30 to 80 | 404 | 379 | 392 | 3.1 |
| | | −30 to 160 | 443 | 379 | 411 | 7.7 |
| | 1500 | −30 to 80 | 369 | 342 | 356 | 3.8 |
| | | −30 to 160 | 390 | 342 | 366 | 6.6 |
| | 1000 | −30 to 80 | 326 | 303 | 314 | 3.7 |
| | | −30 to 160 | 332 | 303 | 317 | 4.5 |
| Example 2 | 2000 | −30 to 80 | 462 | 429 | 446 | 3.7 |
| | | −30 to 160 | 566 | 429 | 498 | 13.8 |
| | 1500 | −30 to 80 | 417 | 388 | 403 | 3.5 |
| | | −30 to 160 | 499 | 388 | 444 | 12.5 |
| | 1000 | −30 to 80 | 417 | 355 | 386 | 8.0 |
| | | −30 to 160 | 422 | 355 | 389 | 8.5 |
| Example 3 | 2000 | −30 to 80 | 462 | 424 | 443 | 4.3 |
| | | −30 to 160 | 519 | 424 | 472 | 10.1 |
| | 1500 | −30 to 80 | 430 | 384 | 407 | 5.6 |
| | | −30 to 160 | 485 | 384 | 434 | 11.5 |
| | 1000 | −30 to 80 | 385 | 347 | 366 | 5.2 |
| | | −30 to 160 | 434 | 347 | 390 | 11.1 |
| Example 4 | 2000 | −30 to 80 | 588 | 559 | 574 | 2.5 |
| | | −30 to 160 | 675 | 559 | 617 | 9.4 |
| | 1500 | −30 to 80 | 537 | 502 | 519 | 3.3 |
| | | −30 to 160 | 572 | 502 | 537 | 6.5 |
| | 1000 | −30 to 80 | 493 | 427 | 460 | 7.2 |
| | | −30 to 160 | 493 | 427 | 460 | 7.2 |
| Example 5 | 2000 | −30 to 80 | 498 | 438 | 468 | 6.3 |
| | | −30 to 160 | 510 | 438 | 474 | 7.5 |
| | 1500 | −30 to 80 | 456 | 395 | 426 | 7.4 |
| | | −30 to 160 | 474 | 395 | 434 | 9.1 |
| | 1000 | −30 to 80 | 438 | 355 | 397 | 10.4 |
| | | −30 to 160 | 450 | 355 | 403 | 11.8 |

TABLE 8

| Example No. | Temperature: T [° C.] | Density: ρ [kgm$^{-3}$] | Specific heat: Cp [Jkg$^{-3}$K$^{-1}$] | Coefficient of thermal diffusivity: α [10$^{-7}$ m$^2$s$^{-1}$] | Coefficient of thermal conductivity: λ [Wm$^{-1}$K$^{-1}$] |
|---|---|---|---|---|---|
| Example 2 | 25 | 4720 | 553 | 8.80 | 2.30 |
|  | 120 | 4720 | 602 | 8.16 | 2.32 |
|  | 160 | 4720 | 621 | 8.15 | 2.39 |
| Comparative example 1 | 25 | 7600 | 335 | 4.73 | 1.20 |
|  | 120 | 7600 | 366 | 4.75 | 1.32 |
|  | 160 | 7600 | 377 | 4.79 | 1.37 |

TABLE 9

| Example No. | Temperature [° C.] | Coefficient of linear thermal expansion: ΔL/L$_0$ [%] | Coefficient of thermal expansion: β [ppm/° C.] |
|---|---|---|---|
| Example 2 | −40 | −0.036 | 5.5 |
|  | −30 | −0.030 | 5.8 |
|  | 0 | −0.012 | 5.3 |
|  | 20 | −0.002 | 4.7 |
|  | 50 | 0.014 | 5.3 |
|  | 80 | 0.029 | 5.2 |
|  | 100 | 0.040 | 5.0 |
|  | 120 | 0.049 | 4.8 |
|  | 140 | 0.059 | 4.6 |
|  | 160 | 0.068 | 4.1 |
|  | 180 | 0.076 | 4.1 |
|  | 200 | 0.083 | 3.6 |
| Comparative example 1 | −40 | −0.035 | 5.7 |
|  | −30 | −0.029 | 5.7 |
|  | 0 | −0.011 | 5.6 |
|  | 20 | −0.002 | 4.3 |
|  | 50 | 0.011 | 3.9 |
|  | 80 | 0.022 | 3.1 |
|  | 100 | 0.027 | 2.7 |
|  | 120 | 0.033 | 2.5 |
|  | 140 | 0.037 | 2.2 |
|  | 160 | 0.041 | 1.9 |
|  | 180 | 0.045 | 1.7 |
|  | 200 | 0.048 | 1.6 |

What is claimed is:

1. The piezoelectric actuator including a piezoelectric element that has a pair of electrodes formed on the surface of a sheet of piezoelectric ceramic, and a holding member that holds the piezoelectric element, wherein:

x, y, and z included in the general formula $\{Li_x(K_{1-y}Na_y)_{1-x}\}\{Nb_{1-z-w}Ta_zSb_w\}O_3$ representing a grain-oriented piezoelectric ceramic satisfy the relationships expressed by the following equations (3) and (4):

$$9x - 5z - 17w \geq -318 \quad (3)$$

$$-18.9x - 3.9z - 5.8w \leq -130 \quad (4).$$

2. The piezoelectric actuator according to claim 1, wherein when the piezoelectric actuator is driven under such a driving condition that a driving voltage shall have a constant amplitude in electric field strength of 100 V/mm or more, the following requirements (f) and (g) are satisfied:

(f) the magnitude of dynamic strain D33 calculated by dividing a strain exhibited in an electric field-applied direction by the piezoelectric actuator by the electric field strength shall be equal to or larger than 250 pm/V over the temperature range from −30° C. to 80° C.; and (g) the width of variation $W_{D33}$ in the magnitude of dynamic strain D33 derived from a change in temperature, which is expressed by the following equation (1), shall fall within ±14% over the temperature range from −30° C. to 80° C.:

$$W_{D33}(\%) = [\{2 \times D33_{max}/(D33_{max} + D33_{min})\} - 1] \times 100 \quad (1)$$

where $D33_{max}$ denotes the maximum value of the magnitude of dynamic strain observed at the temperatures ranging from −30° C. to 80° C., and $D33_{min}$ denotes the minimum value of the magnitude of dynamic strain observed at the temperatures ranging from −30° C. to 80° C.

3. The piezoelectric actuator according to claim 1, wherein when the piezoelectric actuator is driven under such a driving condition that a driving voltage shall have a constant amplitude in electric field strength of 100 V/mm or more, the following requirements (h) and (i) are satisfied:

(h) the magnitude of dynamic strain D33 calculated by dividing a strain exhibited in an electric field-applied direction by the piezoelectric actuator by the electric field strength shall be equal to or larger than 250 pm/V over the temperature range from −30° C. to 160° C.; and (i) the width of variation $W_{D33}$ in the magnitude of dynamic strain derived from a change in temperature, which is expressed by the following general equation (2), shall fall within ±14% over the temperature range from −30° C. to 160° C.:

$$W_{D33}(\%) = [\{2 \times D33_{max}/(D33_{max} + D33_{min})\} - 1] \times 100 \quad (2)$$

where $D33_{max}$ denotes the maximum value of the magnitude of dynamic strain observed at the temperatures ranging from −30° C. to 160° C., and $D33_{min}$ denotes the minimum value of the magnitude of dynamic strain observed at the temperatures ranging from −30° C. to 160° C.

4. The piezoelectric actuator according to claim 1, wherein the piezoelectric actuator is adapted to a fuel injection valve.

5. The piezoelectric actuator according to claim 1, wherein the piezoelectric actuator is adapted to any of a sonar, an ultrasonic motor, and a piezoelectric ultrasonic transducer.

6. The piezoelectric actuator according to claim 1, wherein the piezoelectric actuator is adapted to a piezoelectric sounding part.

7. The piezoelectric actuator according to claim 1, wherein the piezoelectric element is a laminated piezoelectric element having sheets of piezoelectric ceramic and electrodes stacked alternately.

8. The piezoelectric actuator according to claim 1, wherein the piezoelectric ceramic is a piezoelectric ceramic that does not contain lead.

9. The piezoelectric actuator according to claim 1, wherein the orientation degree of the pseudo-cubic {100} planes of grains constituting the grain-oriented piezoelectric ceramic, which is calculated according to a Lotgering's method, is equal to or larger than 30%, and the crystal system is the tetragonal system over a temperature range from 10° C. to 160° C.

10. The piezoelectric actuator according to claim 2, wherein when the piezoelectric actuator is driven under such a driving condition that a driving voltage shall have a constant amplitude in electric field strength of 100 V/mm or more, the following requirements (h) and (i) are satisfied:

(h) the magnitude of dynamic strain D33 calculated by dividing a strain exhibited in an electric field-applied direction by the piezoelectric actuator by the electric field strength shall be equal to or larger than 250 pm/V over the temperature range from −30° C. to 160° C.; and (i) the width of variation $W_{D33}$ in the magnitude of dynamic strain derived from a change in temperature, which is expressed by the following general equation (2), shall fall within ±14% over the temperature range from −30° C. to 160° C.:

$$W_{D33}(\%)=[\{2\times D33_{max}/(D33_{max}+D33_{min})\}-1]\times 100 \quad (2)$$

where $D33_{max}$ denotes the maximum value of the magnitude of dynamic strain observed at the temperatures ranging from −30° C. to 160° C., and $D33_{min}$ denotes the minimum value of the magnitude of dynamic strain observed at the temperatures ranging from −30° C. to 160° C.

11. The piezoelectric actuator according to claim 10, wherein the orientation degree of the pseudo-cubic {100} planes of grains constituting the grain-oriented piezoelectric ceramic, which is calculated according to a Lotgering's method, is equal to or larger than 30%, and the crystal system is the tetragonal system over a temperature range from 10° C. to 160° C.

12. The piezoelectric actuator according to claim 1, wherein the piezoelectric ceramic satisfies at least one of the following requirements (a) to (e):

(a) the bulk density shall be equal to or smaller than 5 g/cm³, and the Young's modulus $Y_{11}^E$ calculated according to a resonance-antiresonance method shall be equal to or larger than 90 GPa;

(b) the coefficient of thermal conductivity shall be equal to or larger than 2 $Wm^{-1}K^{-1}$;

(c) the coefficient of thermal expansion shall be equal to or larger than 3.0 ppm/° C. over a temperature range from −30° C. to 160° C.;

(d) the pyroelectric coefficient shall be equal to or smaller than 400 $\mu Cm^{-2}K^{-1}$ over the temperature range from −30° C. to 160° C.; and (e) the mechanical quality factor Qm calculated according to the resonance-antiresonance method shall be equal to or smaller than 50 over a temperature range from −30° C. to 80° C.

* * * * *